United States Patent
Gordon et al.

(10) Patent No.: US 10,957,820 B2
(45) Date of Patent: Mar. 23, 2021

(54) MONOLITHIC, SEGMENTED LIGHT EMITTING DIODE ARRAY

(71) Applicant: Lumileds LLC, San Jose, CA (US)

(72) Inventors: Luke Gordon, Santa Barbara, CA (US); Oleg Shchekin, San Francisco, CA (US); Ashish Tandon, Sunnyvale, CA (US); Rajat Sharma, San Jose, CA (US); Joseph Flemish, Palo Alto, CA (US); Andrei Papou, San Jose, CA (US); Wen Yu, Pleasanton, CA (US); Erik Young, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/226,609

(22) Filed: Dec. 19, 2018

(65) Prior Publication Data

US 2019/0198716 A1    Jun. 27, 2019

Related U.S. Application Data

(60) Provisional application No. 62/609,116, filed on Dec. 21, 2017.

(30) Foreign Application Priority Data

Feb. 7, 2018   (EP) .................... 18155481.7

(51) Int. Cl.
*H01L 33/46*       (2010.01)
*H01L 27/15*       (2006.01)
(Continued)

(52) U.S. Cl.
CPC ............ *H01L 33/46* (2013.01); *H01L 27/156* (2013.01); *H01L 33/10* (2013.01); *H01L 33/60* (2013.01);
(Continued)

(58) Field of Classification Search
CPC ....................................................... H01L 33/46
(Continued)

(56) References Cited

U.S. PATENT DOCUMENTS

| 6,410,942 B1 | 6/2002 | Thibeault et al. |
| 9,041,025 B2 | 5/2015 | Lau et al. |

(Continued)

FOREIGN PATENT DOCUMENTS

| TW | 200623467 A | 7/2006 |
| TW | I545741 B | 8/2016 |

(Continued)

OTHER PUBLICATIONS

Dupré et al., "Processing and characterization of high-resolution GaN/InGaN LED arrays at 10 micron pitch for micro display applications," Proceedings vol. 10104 (2017).

*Primary Examiner* — Ajay Arora

(57) ABSTRACT

A light-emitting device is disclosed which includes a segmented active layer disposed between a segmented conductivity layer and a continuous conductivity layer, the active layer, the segmented conductivity layer, and the continuous conductivity layer being arranged to define a plurality of pixels, each pixel including a different segment of the segmented conductivity layer and the segmented active layer. A continuous wavelength converting layer disposed on the continuous conductivity layer is provided. A plurality of first contacts, each first contact being electrically connected to a different segment of the segmented conductivity layer is provided. One or more second contacts that are electrically connected to the continuous conductivity layer are also provided, the number of second contacts being less than the number of first contacts.

20 Claims, 17 Drawing Sheets

(51) Int. Cl.
   *H01L 33/10* (2010.01)
   *H01L 33/60* (2010.01)
   *H01L 33/50* (2010.01)
   *H01L 25/075* (2006.01)
   *H01L 33/44* (2010.01)
   *H01L 33/58* (2010.01)
(52) U.S. Cl.
   CPC .......... *H01L 25/0753* (2013.01); *H01L 33/44* (2013.01); *H01L 33/504* (2013.01); *H01L 33/505* (2013.01); *H01L 33/58* (2013.01)
(58) Field of Classification Search
   USPC .......................................................... 257/98
   See application file for complete search history.

(56) References Cited

U.S. PATENT DOCUMENTS

| | | | |
|---|---|---|---|
| 9,978,727 B2 | 5/2018 | Takeya et al. | |
| 9,997,688 B2 | 6/2018 | Takeya et al. | |
| 10,050,026 B2 | 8/2018 | Takeya et al. | |
| 2002/0015013 A1 | 2/2002 | Ragle | |
| 2006/0062352 A1* | 3/2006 | Nomura | H01L 27/14603 |
| | | | 378/98.8 |
| 2006/0214173 A1 | 9/2006 | Beeson et al. | |
| 2008/0272712 A1* | 11/2008 | Jalink | H01L 27/153 |
| | | | 315/291 |
| 2011/0205049 A1 | 8/2011 | Kmetec et al. | |
| 2012/0119237 A1* | 5/2012 | Leatherdale | H01L 27/156 |
| | | | 257/88 |
| 2016/0190400 A1 | 6/2016 | Jung et al. | |
| 2017/0098746 A1 | 4/2017 | Bergmann et al. | |
| 2017/0294418 A1 | 10/2017 | Edmond et al. | |
| 2018/0019369 A1 | 1/2018 | Cho et al. | |
| 2018/0074372 A1 | 3/2018 | Takeya et al. | |
| 2018/0129121 A1* | 5/2018 | Van Der Sijde | H01L 33/505 |
| 2018/0174519 A1 | 6/2018 | Kim et al. | |
| 2018/0283642 A1 | 10/2018 | Liao et al. | |
| 2018/0371315 A1 | 12/2018 | Hofmann et al. | |

FOREIGN PATENT DOCUMENTS

| | | | |
|---|---|---|---|
| TW | I575741 B | 8/2016 | |
| WO | 2007/034367 | 3/2007 | |
| WO | WO-2008109296 A1 * | 9/2008 | .............. F21S 41/43 |
| WO | 2010/123809 | 10/2010 | |
| WO | 2011/014490 | 2/2011 | |
| WO | 2016/079505 | 5/2016 | |
| WO | 2017/102708 A1 | 6/2017 | |
| WO | 2018/091657 A1 | 5/2018 | |

\* cited by examiner

MONOLITHIC, SEGMENTED LIGHT EMITTING DIODE ARRAY

BACKGROUND

Light emitting diodes ("LEDs") are commonly used as light sources in various applications. LEDs are more energy-efficient than traditional light sources, providing much higher energy conversion efficiency than incandescent lamps and fluorescent light, for example. Furthermore, LEDs radiate less heat into illuminated regions and afford a greater breadth of control over brightness, emission color and spectrum than traditional light sources. These characteristics make LEDs an excellent choice for various lighting applications ranging from indoor illumination to automotive lighting.

Many LED-based lighting systems rely on a single light source. Selective full or partial light masking can modify direction or intensity of light projected by such systems or redirection of unwanted light into an absorber.

SUMMARY

A light-emitting device is disclosed which includes a segmented active layer disposed between a segmented conductivity layer and a continuous conductivity layer, the active layer, the segmented conductivity layer, and the continuous conductivity layer being arranged to define a plurality of pixels, each pixel including a different segment of the segmented conductivity layer and the segmented active layer. A continuous wavelength converting layer disposed on the continuous conductivity layer is provided. A plurality of first contacts, each first contact being electrically connected to a different segment of the segmented conductivity layer is provided. One or more second contacts that are electrically connected to the continuous conductivity layer are also provided, the number of second contacts being less than the number of first contacts.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
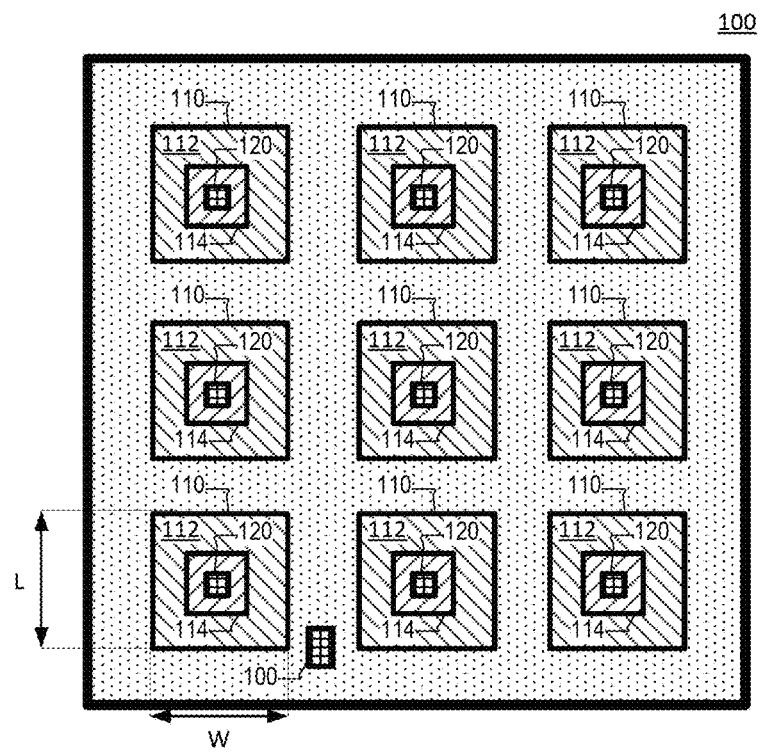
FIG. 1A is a bottom-up view of an example of an LED array, according to aspects of the disclosure.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Figure 1B:
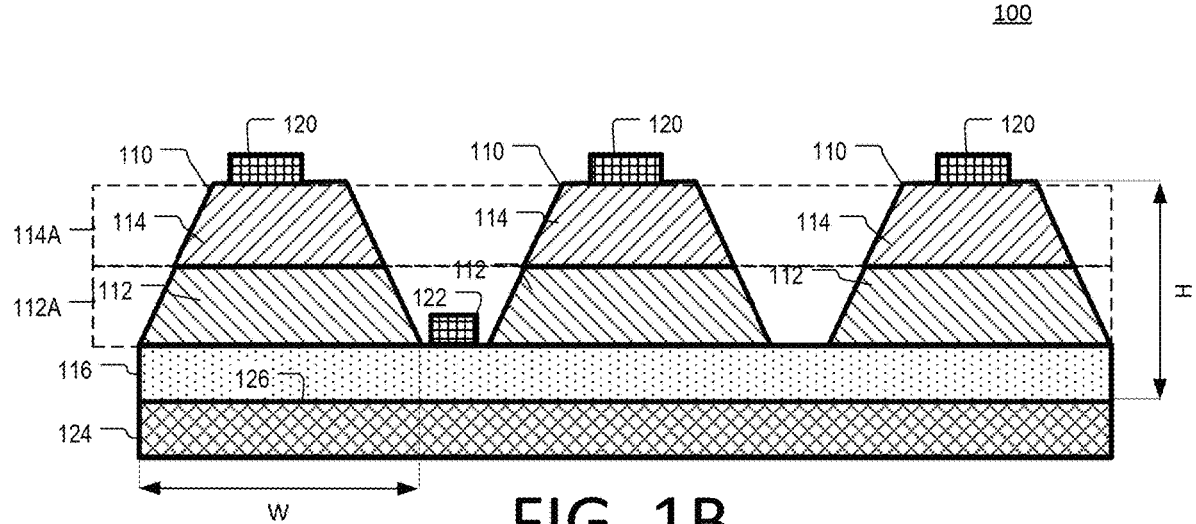
FIG. 1B is a cross-sectional side view of the LED array of FIG. 1A, according to aspects of the disclosure.

FIGS. 1A and 1B depict an example of an LED matrix 100, according to aspects of the disclosure. The matrix 100 includes a segmented active layer 112A that is sandwiched between a segmented conductivity layer 114A, and a continuous conductivity layer 116. The segmented active layer 112A may include a plurality of active layer segments 112 that are formed by etching trenches into the active layer 112A after it has been epitaxially grown. The segmented conductivity layer 114A may include a plurality of conductivity layer segments 114 that are formed by etching trenches into the conductivity layer 114A after it has been epitaxially grown. The layers 112A, 114A, and 116 may be formed of a III-nitride material, a III-phosphide material, and/or any other suitable type of material that can be used to manufacture LEDs.

The layers 112A, 114A, and 116 may define a plurality of pixels 110 as shown. Each pixel 110 may be a different respective LED. Furthermore, each pixel 110 may include a respective active layer segment 112 that is sandwiched between a respective conductivity layer segment 114 and the continuous conductivity layer 116, which in the present example is shared among the pixels 110 in the matrix 100. In the present example, the conductivity layer segment 114 is an p-type layer and the conductivity layer 116 is a n-type layer. However, alternative implementations are possible in which the conductivity layer segment 114 is a n-type layer, while the conductivity layer 116 is an p-type layer.

The pixels 110 in the matrix 100 may be relatively small in size. For example, each pixel 110 may have a width W in the range of 10-500 microns. Furthermore, each pixel may have a length L in the range of 10-500 microns and a height H in the range of 5-30 microns. The width W of any of the pixels 110 may be the same or different from the length L of the same pixel 110.

The pixels 110 in the LED matrix 100 may be independently addressable. Each pixel 110 may be provided with a different contact 120 that is positioned on top of the respective conductivity layer segment 114 of that pixel. Furthermore, each of the pixels may be provided with a contact 122 which is shared among the pixels 110. The contact 122 may be disposed on the continuous conductivity layer 116. As noted above sharing the same contact among multiple pixels may reduce the complexity of connecting the pixels 110 to a driving logic.

A continuous wavelength converting layer 124 may be disposed on the conductivity layer 116, as shown. The wavelength converting layer 124 may be operable to absorb light emitted from the pixels 110 which has a first wavelength and emit light having a second wavelength that is different from the first wavelength. In some implementations, the wavelength converting layer 124 may be operable to convert blue light that is emitted by the pixels 110 to white light and/or any other suitable color of light. The wavelength converting layer 124 may include a phosphor material suspended in silicon slurry (or another matrix material). The phosphor material may include any suitable type of phosphor, such as a green phosphor, a red phosphor, a yellow phosphor, etc. In some implementations, the wavelength converting layer 124 may include a combination of two or more different phosphors, such as a combination of a green phosphor and red phosphor.

Although in the present example, the wavelength converting layer 124 includes a phosphor suspended in a matrix material, alternative implementations are possible in which the wavelength converting layer 124 includes a tile that is produced by sintering a phosphor material. Additionally or alternatively, in some implementations, the wavelength converting layer 124 may include a tile that is formed by depositing a phosphor material over a substrate (e.g., glass). The present disclosure is thus not limited to any specific technique for forming the wavelength converting layer 124.

In some implementations, the wavelength converting layer 124 may be disposed directly on the surface 126 of the conductivity layer 116. Additionally or alternatively, in some implementations, the wavelength converting layer 124 may be separated from the surface 126 of the conductivity layer 116 by a passivation layer and/or another type of layer that is situated between the wavelength converting layer 124 and the conductivity layer 116. In some implementations, the surface 126 may be exposed by removing a growth substrate (e.g., sapphire) on which the pixels 110 are formed. The growth substrate may be removed (e.g., substantially removed, partially removed, and/or completely removed) by using any suitable technique, such as back grinding, fly cutting, polishing or abrasion blasting. In some implementations, a light extraction pattern may be formed on the surface of the conductivity layer that is exposed as a result of the growth substrate being removed.

Figure 2A:
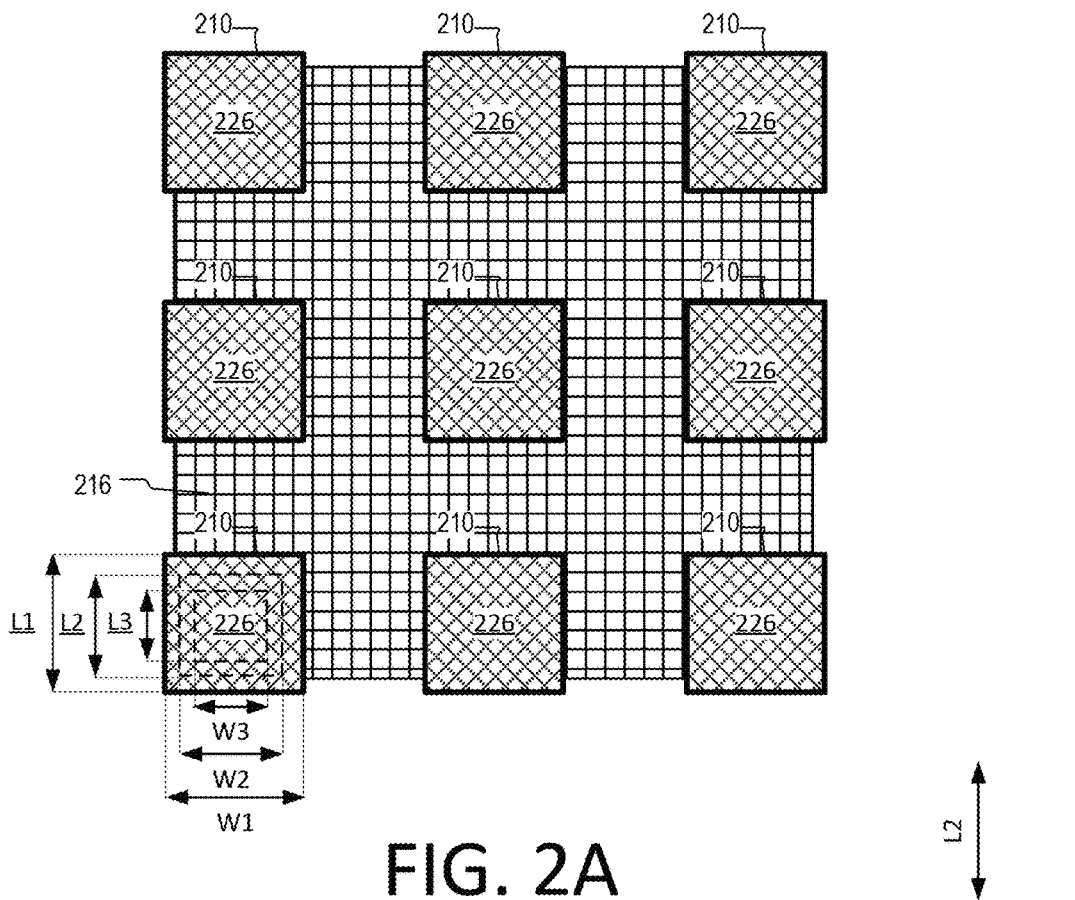
FIG. 2A is a top-down view of another example of an LED array, according to aspects of the disclosure.
Figure 2B:
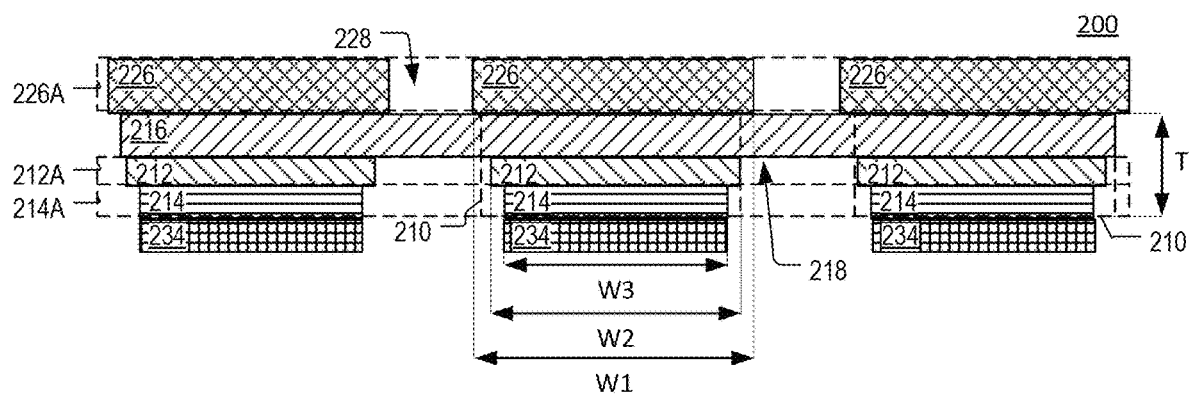
FIG. 2B is a cross-sectional side view of the LED array of FIG. 2A, according to aspects of the disclosure.

FIGS. 2A and 2B depict an example of an LED matrix 200, according to aspects of the disclosure. As illustrated, the matrix 200 includes a plurality of pixels 210 arranged in a grid. The matrix 200 may include a segmented active layer 212A that is sandwiched between segmented conductivity layer 214A, and a continuous conductivity layer 216. The segmented active layer 212A may include a plurality of active layer segments 212 that are formed by etching trenches 218 into the active layer 212A after it has been epitaxially grown. The segmented conductivity layer 214A may include a plurality of conductivity layer segments 214 that are formed by etching the trenches 218 into the active layer 214A after it has been epitaxially grown. The layers 212A, 214A, and 216 may be formed of a III-nitride material, a III phosphide material, and/or any other suitable type of material that can be used to manufacture LEDs.

The layers 212A, 214A, and 216 may form a plurality of pixels 210 as shown. Each pixel may be a different LED, in some implementations. Each pixel 210 may be formed of an active layer segment 212 that is sandwiched between a conductivity layer segment 214 and the continuous conductivity layer 216, which is shared among the pixels 210. In the present example, each conductivity layer segment 214 is an n-type layer and the continuous conductivity layer 216 is a p-type layer. However, alternative implementations are possible in which each conductivity layer segment 214 is a p-type layer, while the continuous conductivity layer 216 is an n-type layer.

A segmented wavelength converting layer 226A may be disposed on the conductivity layer 216, as shown. The wavelength converting layer 226A may be operable to absorb light emitted from the pixels 210 which has a first wavelength and emit light having a second wavelength that is different from the first wavelength. In some implementations, the wavelength converting layer 226A may be operable to convert blue light that is emitted by the pixels 210 to white light and/or any other suitable color of light. The wavelength converting layer 226A may include a phosphor material suspended in silicon slurry (or another matrix material). The phosphor material may include any suitable type of phosphor, such as a green phosphor, a red phosphor, a yellow phosphor, etc. In some implementations, the wavelength converting layer 226A may include a combination of two or more different phosphors, such as a combination of a green phosphor and red phosphor. The wavelength converting layer 226A may include a plurality of segments 226 that are separated by trenches 228, as shown.

In some implementations, the pixels 210 in the matrix 200 may have a cascading arrangement. For example, each wavelength converting layer segment 226 may be wider (and/or longer) than the active layer segment 212 that is situated underneath it. Additionally or alternatively, each active layer segment 212 may be wider and/or longer than the conductivity layer segment 214 that is situated underneath it. In some implementations, as illustrated, the width W1 of any wavelength converting layer segment 226 may be greater than the width W2 of the active layer segment 212 that is situated underneath it, and the width W2 of any active layer segment 212 may be greater than the width W3 of the conductivity layer segment 214 that is situated underneath it. Additionally or alternatively, in some implementations, the length L1 of any wavelength converting layer segment 226 may be greater than the length L2 of the active layer segment 212 that is situated underneath it, and the length L2 of any active layer segment 212 may be greater than the length L3 the conductivity layer segment 214 that is situated underneath it.

The pixels 210 in the matrix 200 may be relatively small in size. For example, any of the pixels 210 may have a width in the range of 10-500 microns. Furthermore, any of the pixels 210 may have a length in the range of 10-500 microns and a thickness T in the range of 5-50 microns. In some implementations, what is referred to as "the width of an pixel 210" may be the width of one of its active layer segment 212, conductivity layer segment 214, and wavelength converting layer segment 226. Additionally or alternatively, what is referred to as "the length of an pixel 210" may be the length of one of its active layer segment 212, conductivity layer segment 214, and wavelength converting layer segment 226. In some implementations, the length of any of the pixels 210 may be equal or different from its width.

In some implementations, the wavelength converting layer 226A may be disposed directly on the surface of the continuous conductivity layer 216. Additionally or alternatively, in some implementations, the wavelength converting layer 226A may be separated from the surface of the continuous conductivity layer 216 by a passivation layer and/or another type of layer that is situated between the wavelength converting layer 226A and the continuous conductivity layer 216. In some implementations, the surface of the continuous conductivity layer 216 on which the wavelength converting layer 226A is formed may be exposed by removing a growth substrate (e.g., sapphire) on which the pixels are exposed. The growth substrate may be removed (e.g., substantially removed, partially removed, and/or completely removed) by using any suitable technique, such as back grinding, fly cutting, polishing or abrasion blasting. In some implementations, a light extraction pattern may be formed on the surface of the continuous conductivity layer 216 that is exposed as a result of the growth substrate being removed.

The pixels 210 in the LED matrix 200 may be independently addressable. Each pixel 210 may be provided with a solder layer 234 that is positioned over the pixel's 210 respective conductivity layer segment 214 and can be used to connect the pixel to control logic. The solder layer 234 may include AuSn solder and/or any other suitable type of solder. Furthermore, the matrix 200 may be provided with an additional contact (not shown) that is shared by the pixels 210. The additional contact may be coupled to the continuous conductivity layer 216, as discussed above with respect to FIG. 1.

Figure 3A:
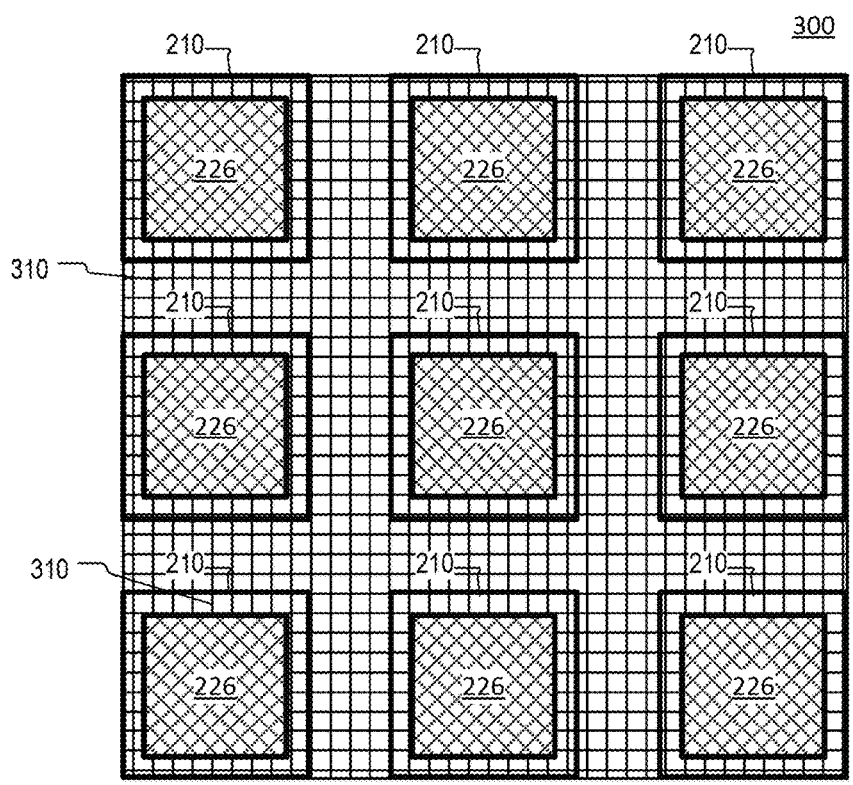
FIG. 3A is a top-down view of yet another example of an LED array, according to aspects of the disclosure.
Figure 3B:
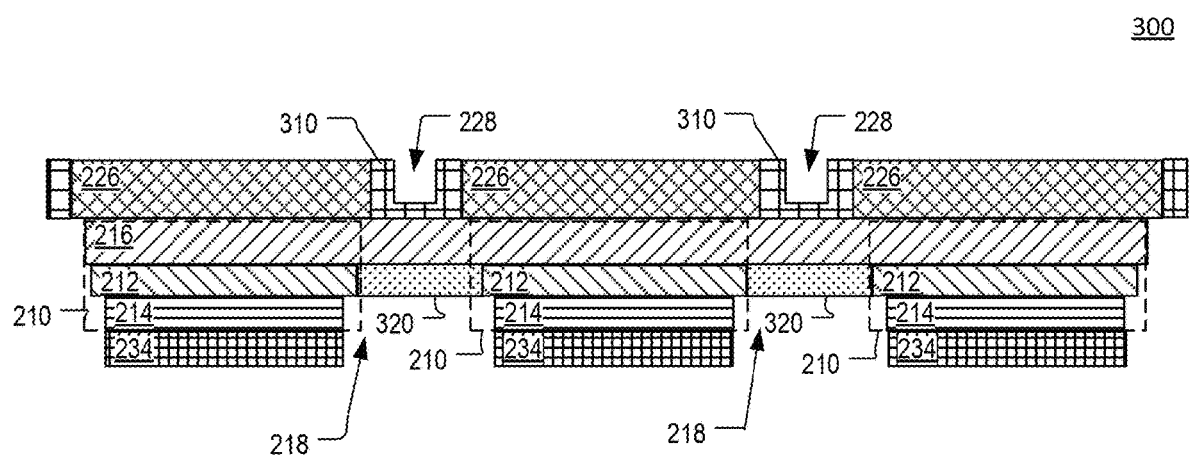
FIG. 3B is a cross-sectional side view of the LED array of FIG. 3A, according to aspects of the disclosure.

FIGS. 3A and 3B depict an example of an LED matrix 300, according to aspects of the disclosure. The LED matrix 300 may be similar to the LED matrix 200 discussed with respect to FIGS. 2A-B. As illustrated, the LED matrix 300 may include a plurality of pixels 210 that are joined by a continuous conductivity layer 216. However, unlike the LED matrix 200, the LED matrix 300 may also include a reflective coating 310 and an absorbent coating 320 that are applied between different pixels 210 in the matrix 300.

The reflective coating 310 may be formed on the sidewalls of the segments 226 and at the bottom of each of the trenches 228. In some implementations, the reflective coating may be formed on the surface of the conductivity layer 216. The reflective coating may be formed of silver, aluminum, and/or any other suitable type of reflective material. In some implementations, the reflective coating 310 may include a DBR. In such instances, the reflective element 310 may include an alternating stack of $SiO_2$ and $TiO_2$ or $Nb_2O_5$ layers that are formed over one another.

The absorbent coating 320 may be applied in the trenches 218, as shown. The absorbent coating 320 may include a TiW or Au or Cu or a combination of metal stacks or dielectric stacks or semiconductor stack coating and/or any other suitable type of coating. In some implementations, the absorbent coating may cover portions of the surface of the conductivity layer 216 that are exposed in the trenches 218. Additionally or alternatively, in some implementations, the absorbent coating 320 may at least partially cover the sidewalls of the active layer segments 212 of the pixels 210 to prevent light from being emitted sideways by each of the pixels 210.

Figure 4A:
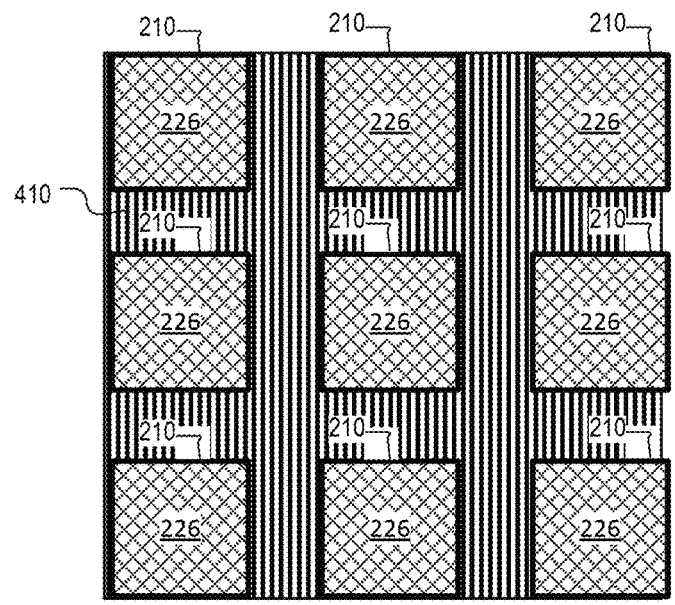
FIG. 4A is a top-down view of yet another example of an LED array, according to aspects of the disclosure.
Figure 4B:
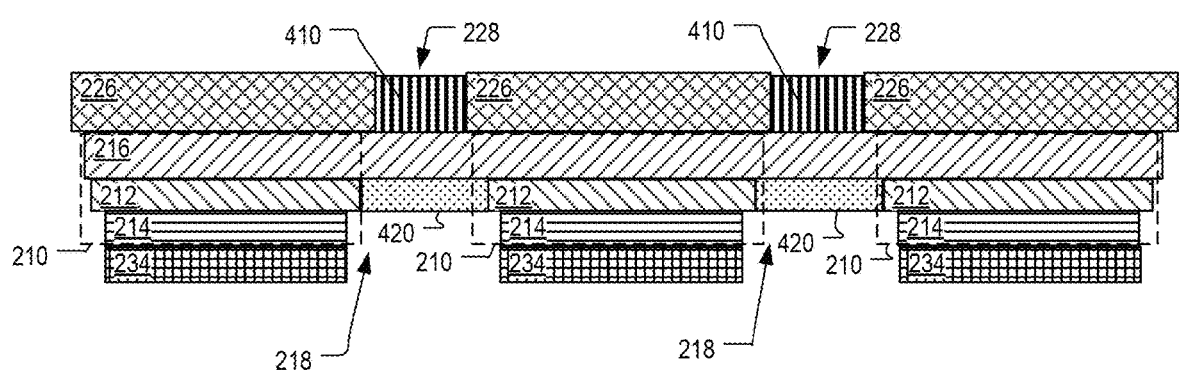
FIG. 4B is a cross-sectional side view of the LED array of FIG. 4A, according to aspects of the disclosure.

FIGS. 4A and 4B depict an example of an LED matrix 400, according to aspects of the disclosure. The LED matrix 400 may be similar to the LED matrix 200 discussed with respect to FIGS. 2A-B. As illustrated, the LED matrix 400 may include a plurality of pixels 210 that are joined by a continuous conductivity layer 216. However, unlike the LED matrix 200, the LED matrix 400 may also include an absorbent coating 410 and an absorbent coating 420 that are applied between different pixels 210 in the matrix 400.

The absorbing coating 410 may be formed in each of the trenches 228, as shown. In some implementations, each of the trenches 228 may be completely filled with the absorbent coating 410. In such instances, the top surface of the absorbent coating 410 may be flush with the top surface of each of the segments 226 and at least some of the sidewalls of the segments 226 may be completely covered by the absorbent coating 410. Additionally or alternatively, in some implementations, the absorbent coating 410 may only partially fill each of the trenches 228. In such instances, at least some of the sidewalls of the segments 226 may be partially covered by the absorbent coating 410. The absorbent coating may include a TiW or Au or Cu or a combination of metals stack, dielectric stack or semiconductor stack coating and/or any other suitable type of coating.

The absorbent coating 420 may be applied in the trenches 218, as shown. The absorbent coating 420 may include a TiW or Au or Cu or combination of metal stack or dielectric stack or semiconductor stack coating and/or any other suitable type of coating. In some implementations, the absorbent coating 420 may cover portions of the surface of the conductivity layer 216 that are exposed in the trenches 218. Additionally or alternatively, in some implementations, the absorbent coating 420 may at least partially cover the sidewalls of the active layer segments 212 of the pixels 210 to prevent light from being emitted sideways by each of the pixels 210. In some implementations, the absorbent coating 420 may have the same composition as the absorbent coating 410. Alternatively, in some implementations, the absorbent coating 420 may have a different composition than the absorbent coating 410.

Figure 5A:
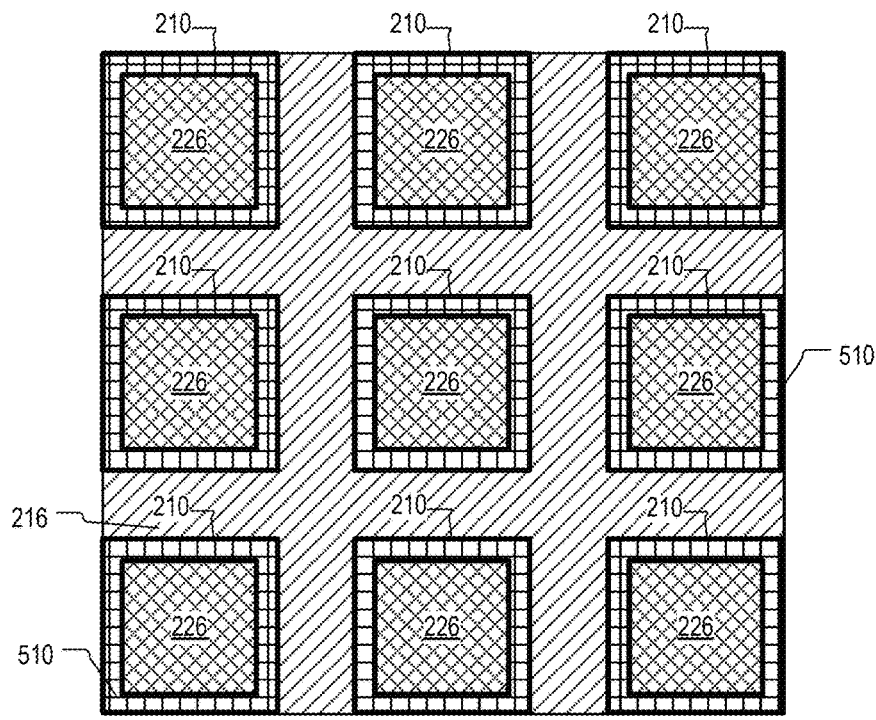
FIG. 5A is a top-down view of yet another example of an LED array, according to aspects of the disclosure.
Figure 5B:
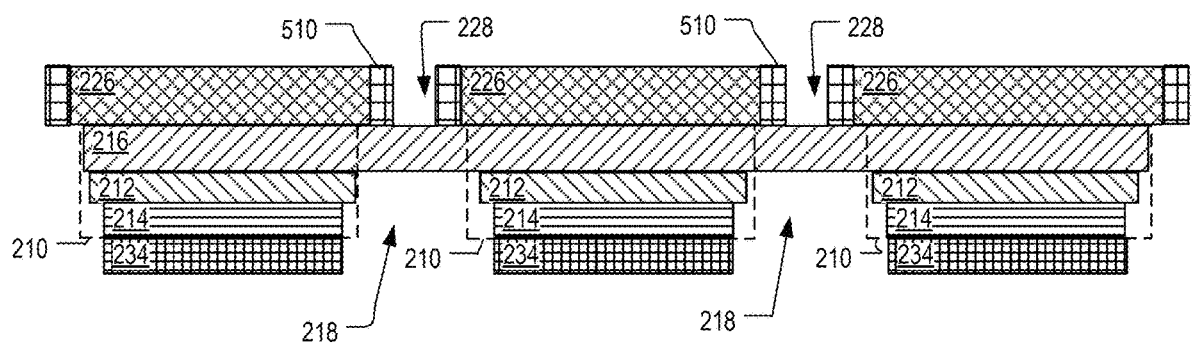
FIG. 5B is a cross-sectional side view of the LED array of FIG. 5A, according to aspects of the disclosure.

FIGS. 5A and 5B depict an example of an LED matrix 500, according to aspects of the disclosure. The LED matrix 500 may be similar to the LED matrix 200 discussed with respect to FIGS. 2A-B. Similar to the LED matrix 200, the LED matrix 500 may include a plurality of pixels 210 that are joined by a continuous conductivity layer 216. However, unlike the LED matrix 200, the LED matrix 500 may also include a reflective coating 510 that is formed on the sidewalls of the segments 226.

The reflective coating 510 may be formed of silver, aluminum, and/or any other suitable type of reflective material. In some implementations, the reflective coating 510 may include a DBR. In such instances, the reflective coating 510 may include an alternating stack of $SiO_2$ and $TiO_2$ layers that are formed over one another. As illustrated, the reflective coating 510 may be formed only on the sidewalls of the segments 226 while leaving at least a portion of the bottom of the trenches 228 exposed. Thus, in instances in which the trenches 228 penetrate the wavelength converting layer 226A completely, portions of the surface of the of the conductivity layer 216 may be left exposed.

Figure 6A:
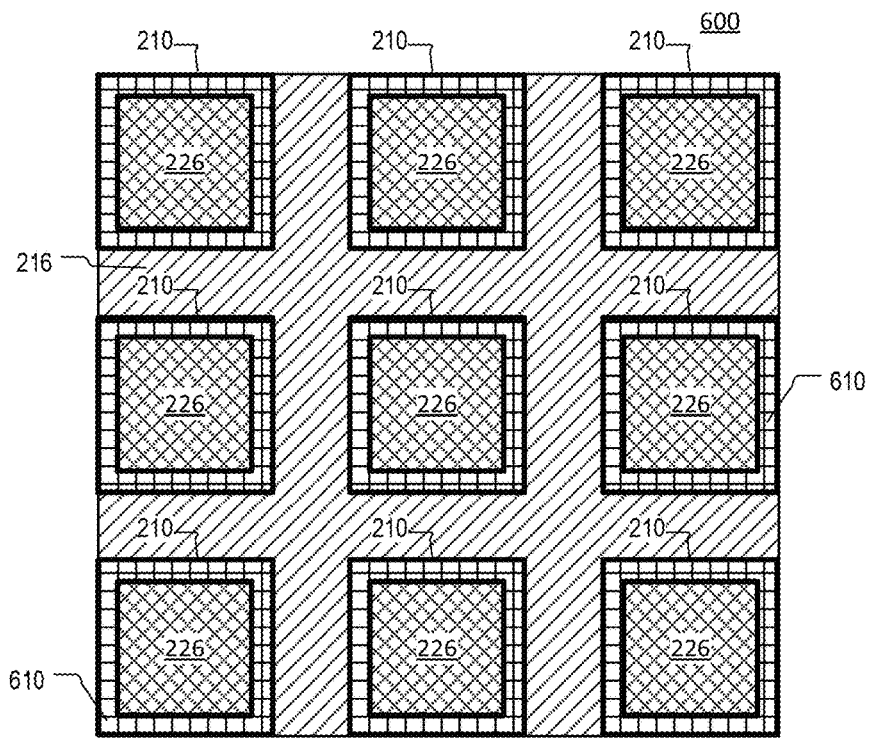
FIG. 6A is a top-down view of yet another example of an LED array, according to aspects of the disclosure.
Figure 6B:
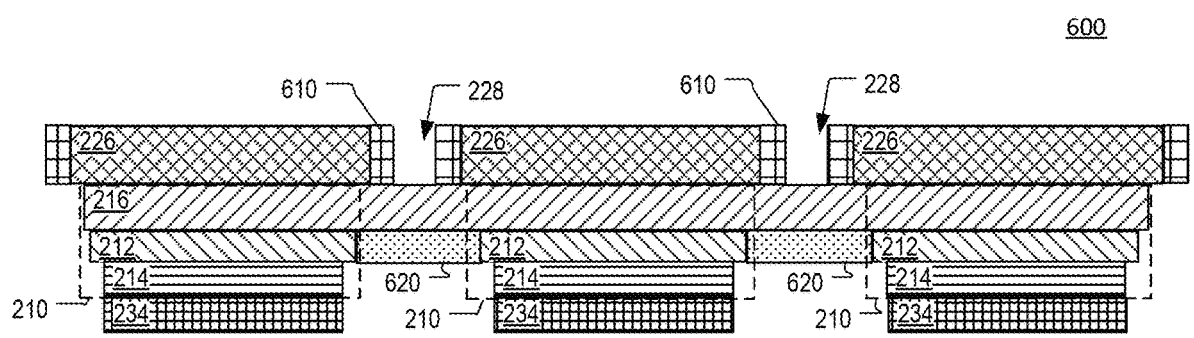
FIG. 6B is a cross-sectional side view of the LED array of FIG. 6A, according to aspects of the disclosure.

FIGS. 6A and 6B depict an example of an LED matrix 600, according to aspects of the disclosure. The LED matrix 600 may be similar to the LED matrix 200 discussed with respect to FIGS. 2A-B. Similar to the LED matrix 200, the LED matrix 600 may include a plurality of pixels 210 that are joined by a continuous conductivity layer 216. However, unlike the LED matrix 200, the LED matrix 600 may also include a reflective coating 610 and an absorbent coating 620 that are formed between different pixels 210 in the LED matrix 600.

The reflective coating 610 may be formed on the sidewalls of the segments 226, as shown. The reflective coating 610 may include silver, aluminum, and/or any other suitable type of reflective material. In some implementations, the reflective coating 610 may include a DBR. In such instances, the reflective element 610 may include an alternating stack of $SiO_2$ and $TiO_2$ layers that are formed over one another. As illustrated, the reflective coating 610 may be formed only on the sidewalls of the segments 226 while leaving at least a portion of the bottom of the trenches 228 exposed.

The absorbent coating 620 may be applied in the trenches 218, as shown. The absorbent coating 620 may include a TiW coating and/or any other suitable type of coating. In some implementations, the absorbent coating 620 may be applied directly on the surface of the continuous conductivity layer 216. Additionally or alternatively, in some implementations, the absorbent coating 620 may at least partially cover the sidewalls of the active layer segments 212 of the pixels 210 to prevent light from being emitted sideways by each of the pixels 210.

Figure 7A:
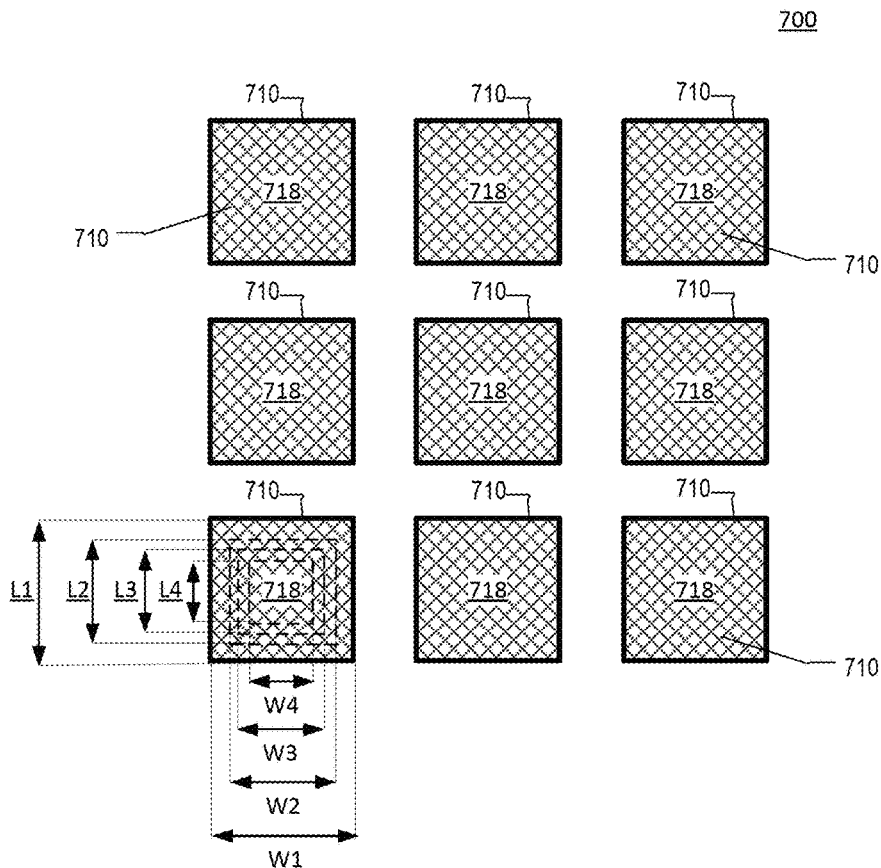
FIG. 7A is a top-down view of yet another example of an LED array, according to aspects of the disclosure.
Figure 7B:
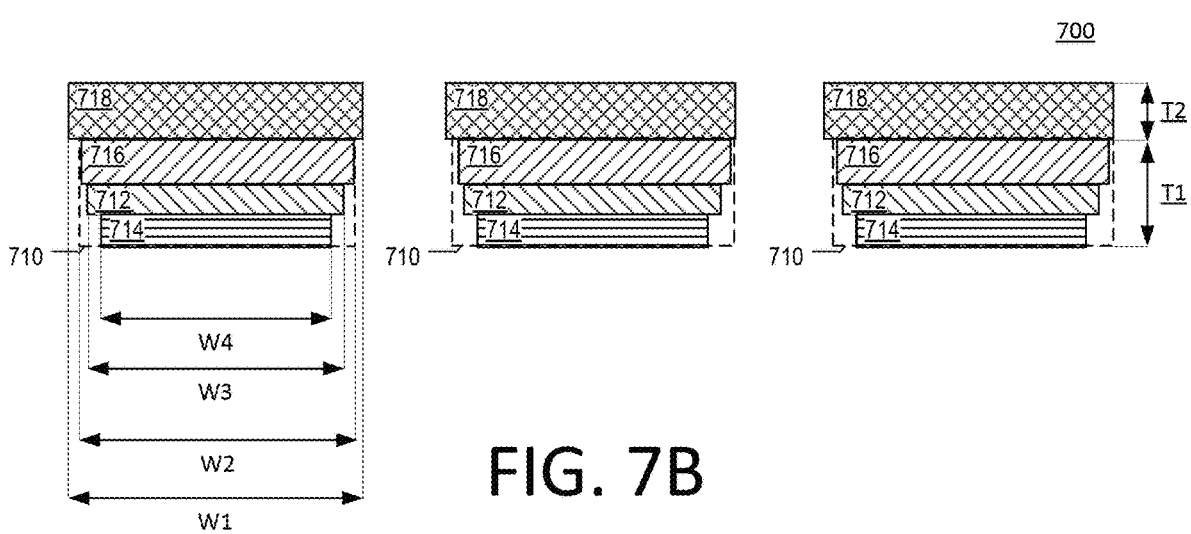
FIG. 7B is a cross-sectional side view of the LED array of FIG. 7A, according to aspects of the disclosure.

FIGS. 7A-B depict an example of an LED matrix 700, according to aspects of the disclosure. The LED matrix 700 may include a plurality of discrete pixels 710, as shown. Unlike the matrix 200 discussed with respect to FIGS. 2A-B, the pixels 710 may be separate from one another, and they may lack a continuous conductivity layer. In some implementations, the pixels 710 may be mounted on a substrate (not shown) that is configured to hold the pixels 710 in a grid arrangement that is similar that of the pixels 210 in the matrix 200.

Each of the pixels 710 may include a respective active layer 712 that is sandwiched between a respective conductivity layer 714 and a respective conductivity layer 716. In the present example, the conductivity layer 714 is an n-type layer and the conductivity layer 716 is a p-type layer. However, alternative implementations are possible in which the conductivity layer 714 is a p-type layer, while the conductivity layer 716 is an n-type layer. The layers 712, 714, and 716 may be formed of a III-nitride material, a III-phosphide material, and/or any other suitable type of material that can be used to manufacture LEDs.

In some implementations, the layers 716 in the LED matrix 700 may be formed by growing a continuous conductivity layer and segmenting it by etching a plurality of trenches in it to form the layers 716. In this regard, each layer 716 may be regarded as a different segment of a segmented conductivity layer. In some implementations, the layers 714 in the LED matrix 700 may be formed by growing a continuous conductivity layer and segmenting it by etching a plurality of trenches in it to form the layers 714. In this regard, each layer 714 may be regarded as a different segment of a segmented conductivity layer. In some implementations, the layers 712 in the LED matrix 700 may be formed by growing a continuous active layer and segmenting it by etching a plurality of trenches in it to form the layers 712. In this regard, each layer 712 may be regarded as a different segment of a segmented active layer. In some implementations, the layers 718 in the LED matrix 700 may be formed by forming a continuous wavelength converting layer and segmenting it by etching a plurality of trenches in it to form the layers 718. In this regard, each layer 718 may be regarded as a different segment of a segmented wavelength converting layer.

Each of the pixels 710 may be provided with a respective wavelength converting layer 718 that is operable to absorb light emitted from the pixels 710 which has a first wavelength and emit light having a second wavelength that is different from the first wavelength. In some implementations, the wavelength converting layer 718 may be operable to convert blue light that is emitted by the pixels 710 to white light and/or any other suitable color of light. The wavelength converting layer 718 may include a phosphor material suspended in silicon slurry (or another matrix material). The phosphor material may include any suitable type of phosphor, such as a green phosphor, a red phosphor, a yellow phosphor, etc. In some implementations, the wavelength converting layer 718 may include a combination of two or more different phosphors, such as a combination of a green phosphor and a red phosphor.

In some implementations, in any pixel 710, the wavelength converting layer 718 may be formed on a surface of the pixel's conductivity layer 716 that is exposed as a result of a growth substrate (e.g., a sapphire on which the pixel 710 is grown), being removed from that surface. According to aspects of the disclosure, the substrate may be substantially removed, partially removed, or completely removed from the surface of the conductivity layer 716 before the wavelength converting layer 718 is formed on that surface. In some implementations, the surface of the conductivity layer 716 on which the wavelength converting layer 718 is formed may include a light extraction pattern formed thereon. Additionally or alternatively, in some implementations, the wavelength converting layer 718 may be formed directly onto the surface of the conductivity layer 716. Additionally or alternatively, the wavelength converting layer 718 may be separated from the surface of the pixel's conductivity layer by at least one passivation layer.

In some implementations, each pixel 710 may have a cascading arrangement. For example, each wavelength converting layer 718 may be wider (and/or longer) than the conductivity layer 716 underneath it. Additionally or alternatively, each conductivity layer 716 may be wider (and/or longer) than the active layer 712 that is situated underneath it. Additionally or alternatively, each active layer 712 may be wider (and/or longer) than the conductivity layer 714 that is situated underneath it. More particularly, the width W1 of any wavelength converting layer 718 may be greater than the width W2 of the conductivity layer 716 that is situated underneath it. The width W2 of any conductivity layer 716 may be greater than the width W3 of the active layer 712 that is situated underneath it. And the width W3 of any active layer 712 may be greater than the width W4 of the conductivity layer 714 that is situated underneath it. Additionally or alternatively, the length L1 of any wavelength converting layer 718 may be greater than the length L2 of the conductivity layer 716 that is situated underneath it. The length L2 of any conductivity layer 716 may be greater than the length L3 of the active layer 712 that is situated underneath it. And the length L3 of any active layer 712 may be greater than the length L4 of the conductivity layer 714 that is situated underneath it.

The pixels 710 in the matrix 700 may be relatively small in size. For example, any of the pixels 710 may have a width in the range of 5-500 microns. Furthermore, any of the pixels 710 may have a length in the range of 5-500 microns and a thickness T in the range of 5-100 microns. In some implementations, what is referred to as "the width of an pixel 710" may be the width of one of its wavelength converting layer 718, conductivity layer 716, conductivity layer 714, and active layer 712. Additionally or alternatively, what is referred to as "the length of a pixel 710" may be the length of one of its wavelength converting layer 718, conductivity layer 716, conductivity layer 714, and active layer 712. In some implementations, the length of any of the pixels 710 may be equal or different from its width.

Although in the present example, the wavelength converting layer 718 includes a phosphor suspended in a matrix material, alternative implementations are possible in which the wavelength converting layer 718 includes a tile that is produced by sintering a phosphor material. Additionally or alternatively, in some implementations, the wavelength converting layer 718 may include a tile that is formed by depositing a phosphor material over a substrate (e.g., glass). Stated succinctly, the present disclosure is not limited to any specific technique for forming the wavelength converting layer 718.

Furthermore, it should be noted that any of the pixels 710 may be provided with one or more contacts for powering the pixel. For instance, each conductivity layer 714 may be provided with a respective solder layer (e.g., an AuSn solder layer) that is the same or similar to the solder layer 234 discussed with respect to FIG. 2. In some aspects, that solder layer may also be used to affix the pixels 710 to a substrate in order to form a grid arrangement that is similar that of the pixels 210 in the matrix 200.

Figure 8A:
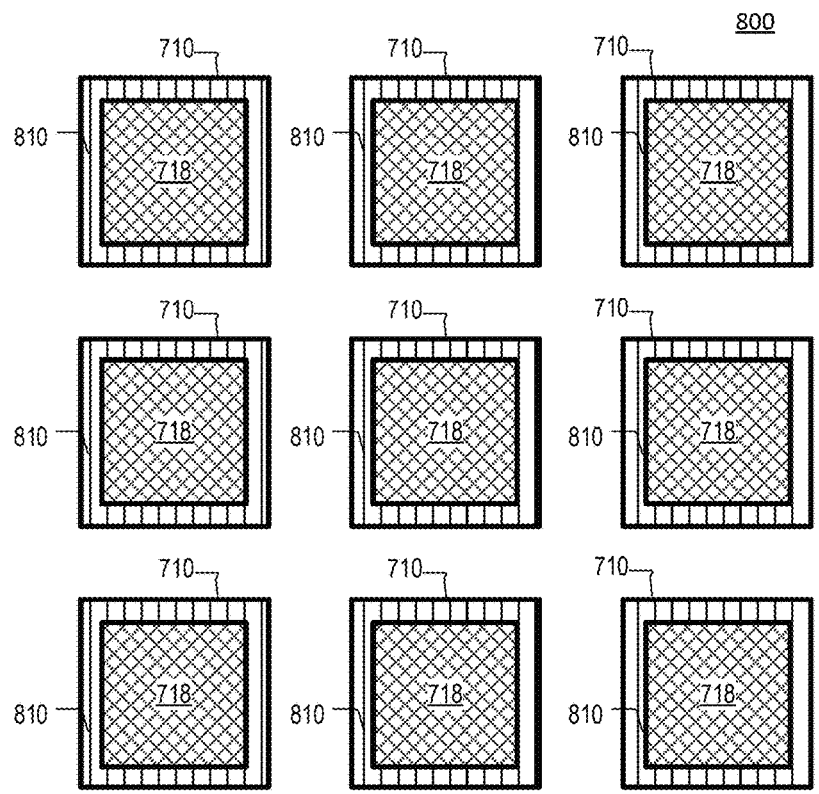
FIG. 8A is a top-down view of yet another example of an LED array, according to aspects of the disclosure.
Figure 8B:
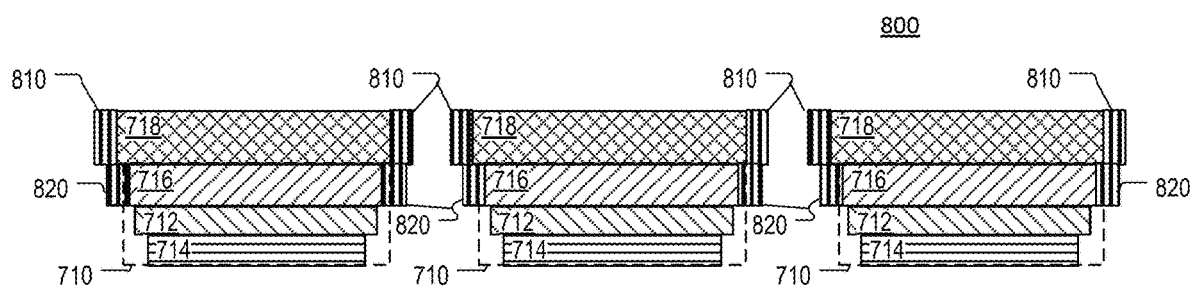
FIG. 8B is a cross-sectional side view of the LED array of FIG. 8A, according to aspects of the disclosure.

FIGS. 8A and 8B depict an example of an LED matrix 800, according to aspects of the disclosure. The LED matrix 800 may be similar to the LED matrix 700 discussed with respect to FIGS. 7A-B. Similar to the LED matrix 700, the LED matrix 800 may include a plurality of discrete pixels 710. However, unlike the LED matrix 700, the LED matrix 800 may also include a reflective coating 810 and a reflective coating 820 that are formed on the sides of each of the pixels 710, as shown.

The reflective coating 810 may be formed on the sidewalls of each wavelength converting layer 718. In some implementations, the sidewalls of any wavelength converting layer 718 may be completely covered by the reflective coating 810. Additionally or alternatively, in some implementations, the sidewalls of any wavelength converting layer 718 may be only partially covered by the reflective coating 810. The reflective coating 810 may include silver, aluminum, and/or any other suitable type of reflective material. In some implementations, the reflective coating 810 may include a DBR. In such instances, the reflective coating 810 may include an alternating stack of $SiO_2$ and $TiO_2$ or $Nb_2O_5$ layers that are formed over one another.

The reflective coating 820 may be formed on the sidewalls of any of the conductivity layers 716. In some implementations, the sidewalls of any conductivity layer 716 may be completely covered by the reflective coating 820. Additionally or alternatively, the sidewalls of any conductivity layer 716 may be only partially covered by the reflective coating 820. The reflective coating 820 may include silver, aluminum, and/or any other suitable type of reflective material. In some implementations, the reflective coating 810 may include a DBR. In such instances, the reflective coating 820 may include an alternating stack of $SiO_2$ and $TiO_2$ or $Nb_2O_5$ layers that are formed over one another.

In some implementations, the coating 810 and the coating 820 may be identical. Alternatively, in some implementations, the coating 810 and the coating 820 may be different from one another. For example, in some implementations, the coating 810 may be formed of different materials than the coating 820. Additionally or alternatively, in some implementations, the coating 810 may include at least one material (or element) that is not found in the coating 820. Additionally or alternatively, in instances in which the coatings 810 and 820 include DBR coatings, the coating 810 may include a different sequence of layers than the coating 820. Additionally or alternatively, in some instances, the coating 810 and the coating 820 may have different reflectance. Additionally or alternatively, in some instances, the coating 810 and the coating 820 may have different thickness.

Additionally or alternatively, in some implementations, the coatings 810 and 820 may be separately formed. As a result, in some implementations, the respective coatings 810 and 820 may not be in direct contact with one another. Alternatively, in some implementations, the respective coatings 810 and 820 may touch one another, as shown in the example of FIGS. 8A-B.

Figure 9A:
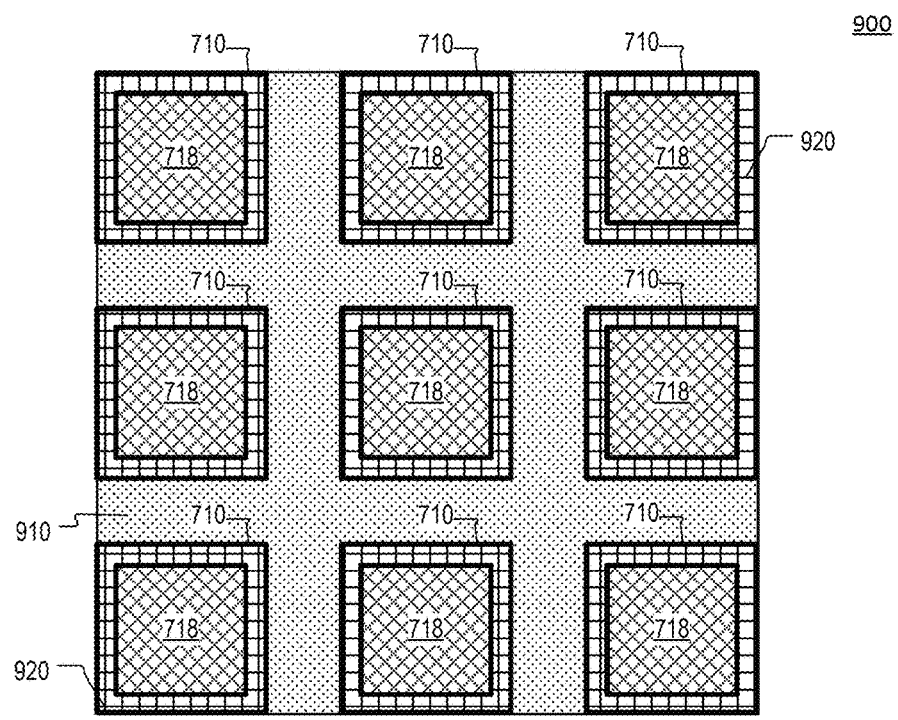
FIG. 9A is a top-down view of yet another example of an LED array, according to aspects of the disclosure.
Figure 9B:
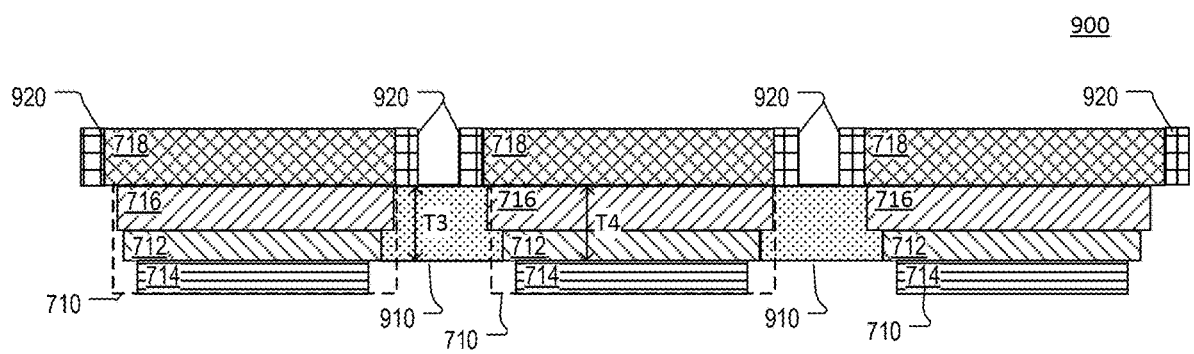
FIG. 9B is a cross-sectional side view of the LED array of FIG. 9A, according to aspects of the disclosure.

FIGS. 9A and 9B depict an example of an LED matrix 900, according to aspects of the disclosure. The LED matrix 900 may be similar to the LED matrix 700 discussed with respect to FIGS. 7A-B. Similar to the LED matrix 700, the LED matrix 900 may include a plurality of discrete pixels 710. However, unlike the LED matrix 700, the pixels 710 in the LED matrix 900 may be joined together by a metal fill 910. Furthermore, any of the pixels 710 may be provided with a reflective coating 920, as shown.

The metal fill 910 may include gold, and/or any other suitable type of material. The metal fill 910 may be disposed between the active layers 712 and the conductivity layers 716 of any two adjacent pixels 710. In some implementations, a layer of dielectric material (not shown) may be formed between the metal fill 910 and the active layers 712. In such instances, the metal fill 910 may be in electrical contact with the conductivity layers 716 while being electrically isolated from the active layers 712. The dielectric layer can include SiO2, SiNx, and/or any other suitable type of dielectric material.

In the present example, the thickness T3 of each metal fill 910 is the same as the combined thickness T4 of the conductivity layers 716 and the active layers 712. However, alternative implementations are possible in which the metal fill 910 has a different thickness. For example, in some implementations, the metal fill 910 may have equal or lower thickness than one of the active layers 712 and the conductivity layers 716. Furthermore, in some implementations, the metal fill 910 may be coupled to only one of the active layers 712 and the conductivity layers 716 of adjacent pixels 710.

The reflective coating 920 may be formed on the sidewalls of the wavelength converting layers 718, as shown. The reflective coating 920 may include silver, aluminum, and/or any other suitable type of reflective material. In some implementations, the reflective coating 610 may include a DBR. In such instances, the reflective coating 920 may include an alternating stack of $SiO_2$ and $TiO_2$ or $Nb_2O_5$ layers that are formed over one another. As illustrated in FIGS. 9A-B, the reflective coating 920 may be formed only on the sidewalls of the wavelength converting layers 718 while leaving at least a portion of the top surface of the metal fill 910 exposed. However, alternative implementations are possible in which the top surface of the metal fill 910 is also covered by the reflective coating 920. Although in the present example, at least some of the sidewalls the wavelength converting layers 718 are coated with the reflective coating 920, alternative implementations are possible in which the reflective coating 920 is not applied on the sides of the wavelength converting layers 718.

Figure 10A:
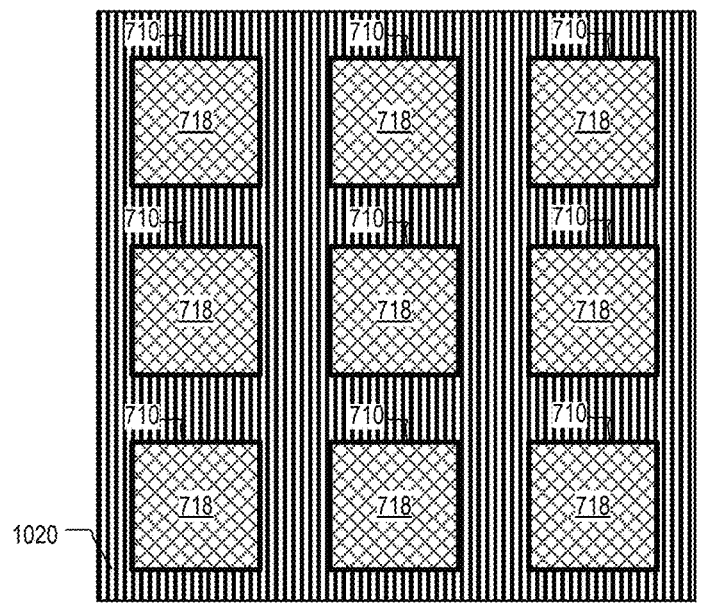
FIG. 10A is a top-down view of yet another example of an LED array, according to aspects of the disclosure.
Figure 10B:
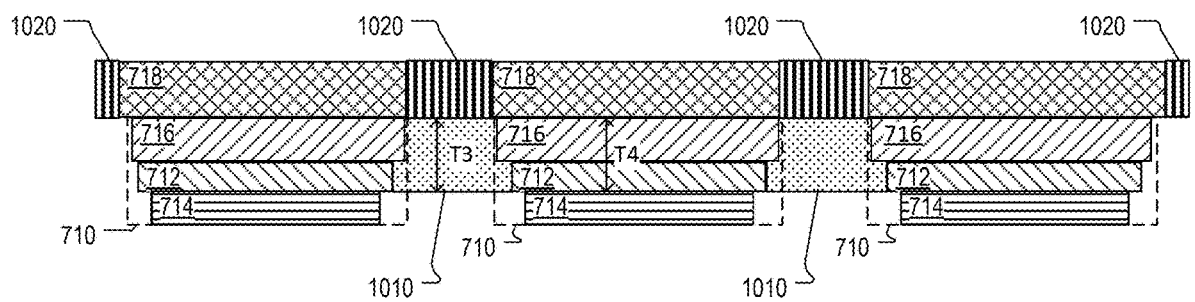
FIG. 10B is a cross-sectional side view of the LED array of FIG. 10A, according to aspects of the disclosure.

FIGS. 10A and 10B depict an example of an LED matrix 1000, according to aspects of the disclosure. The LED matrix 1000 may be similar to the LED matrix 700 discussed with respect to FIGS. 10A-B. Similar to the LED matrix 700, the LED matrix 1000 may be a plurality of discrete pixels 710. However, unlike the LED matrix 700, the pixels 710 in the LED matrix 1000 may be joined together by a metal fill 1010 and a reflective side coating 1020.

The metal fill 1010 may include gold and/or any other suitable type of material. The metal fill 1010 may be disposed between the active layers 712 and the conductivity layers 716 of any two adjacent pixels 710. In the present example, the thickness T3 of each metal fill 1010 is the same as the combined thickness T4 of the conductivity layers 716 and the active layers 712. However, alternative implementations are possible in which the metal fill 1010 has a different thickness. For example, in some implementations, the metal fill 1010 may have equal or lower thickness than one of the active layers 712 and the conductivity layers 716. Furthermore, in some implementations, the metal fill 1010 may be coupled to only one of the active layers 712 and the conductivity layers 716 of adjacent pixels 710.

The reflective side coating 1020 may include any suitable type of reflective material. In some implementations, the reflective side coating 1020 may include one or more overmolded or dispensed reflective side coatings made with diffuse reflective materials, such as polymers loaded with TiO2 and other particulates of organic and inorganic materials. Additionally or alternatively, the reflective side coating may be formed of silver, aluminum, and/or any other suitable type of reflective material. In some implementations, the reflective side coating 1020 may include a DBR. In such instances, the reflective side coating 1020 may include an alternating stack of $SiO_2$ and $TiO_2$ or $Nb_2O_5$ layers that are formed over one another. Although in the present example the reflective side coating 1020 is disposed between the wavelength converting layers 718, alternative implementations are possible in which absorbent coating is instead disposed between the wavelength converting layers 718.

FIGS. 1A-10B are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples. By way of example, and without limitation, the term "absorbent coating," as used in the examples provided with respect to FIGS. 1A-10B, may refer to any suitable type of coating which has a light absorption rate that is greater than 10%. By way of example, and without limitation, the term "reflective coating," as used in the examples provided with respect to FIGS. 1A-10B, may refer to any suitable type of coating which has a reflectivity that is greater than 90%.

Figure 11A:
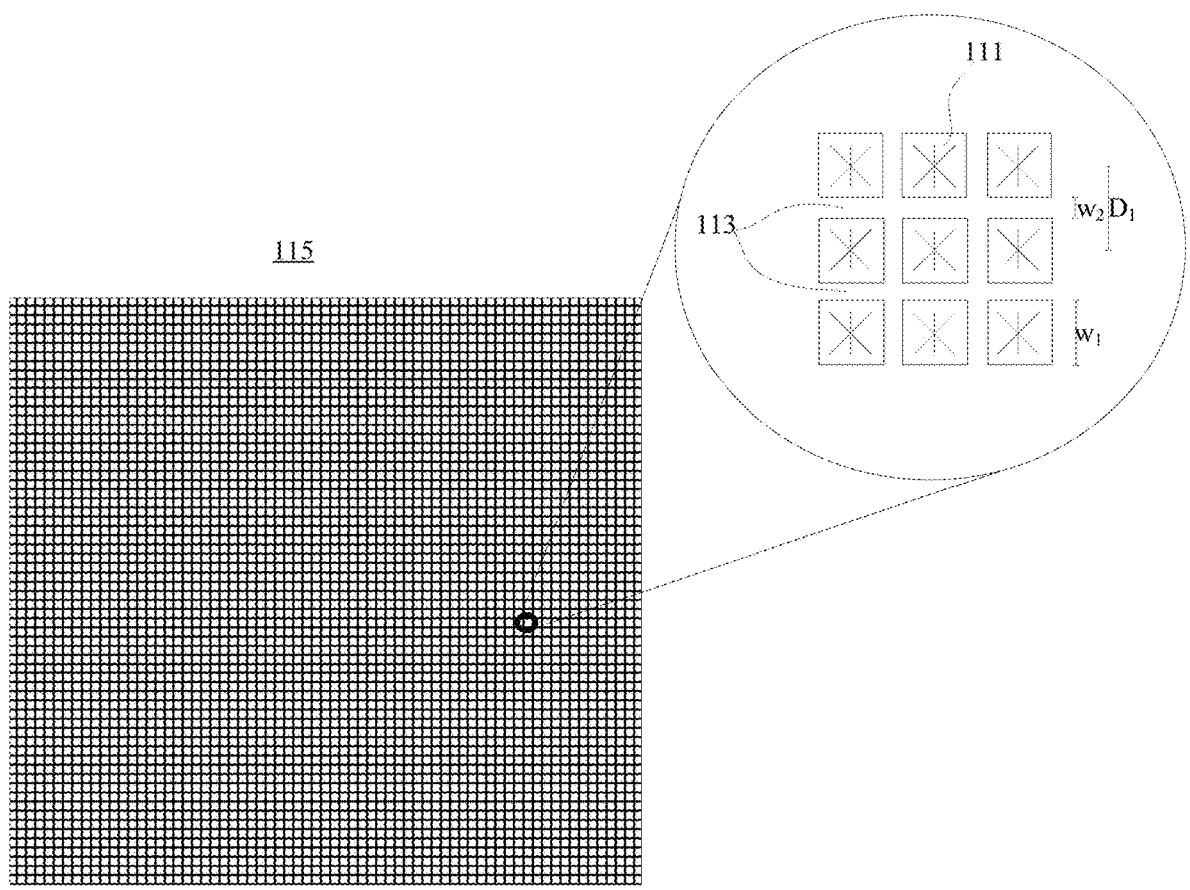
FIG. 11A is a top view illustration of an LED array with an exploded portion.

According to embodiments of the disclosed subject matter, LED arrays (e.g., micro LED arrays) may include an array of pixels as shown in FIGS. 11A, 1B, and/or 1C. LED arrays may be used for any applications such as those requiring precision control of LED array segments. Pixels in an LED array may be individually addressable, may be addressable in groups/subsets, or may not be addressable. In FIG. 11A, a top view of a LED array 115 with pixels 111 is shown. An exploded view of a 3×3 portion of the LED array 115 is also shown in FIG. 11A. As shown in the 3×3 portion exploded view, LED array 115 may include pixels 111 with a width $w_1$ of approximately 100 μm or less (e.g., 40 μm).

The lanes 113 between the pixels may be separated by a width, $w_2$, of approximately 20 µm or less (e.g., 5 µm). The lanes 113 may provide an air gap between pixels or may contain other material, as shown in FIGS. 1B and 10 and further disclosed herein. The distance $d_1$ from the center of one pixel 111 to the center of an adjacent pixel 111 may be approximately 120 µm or less (e.g., 45 µm). It will be understood that the widths and distances provided herein are examples only, and that actual widths and/or dimensions may vary. Pixels 111 in the LED array 115 may be arranged in accordance with one or more of the arrangements shown in FIGS. 1A-10B.

It will be understood that although rectangular pixels arranged in a symmetric matrix are shown in FIGS. 1A, B and C, pixels of any shape and arrangement may be applied to the embodiments disclosed herein. For example, LED array 115 of FIG. 11A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

Figure 11B:
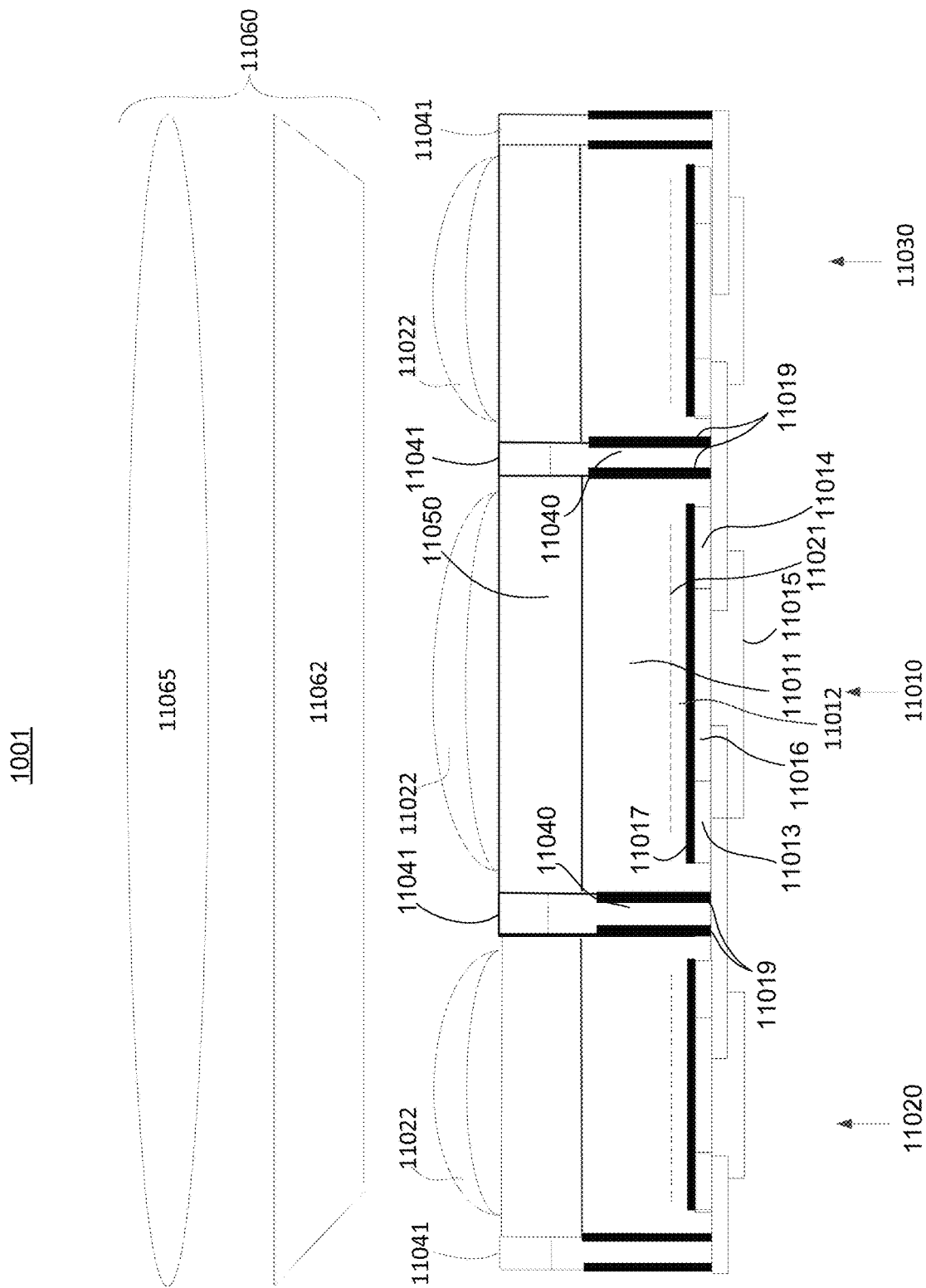
FIG. 11B is a cross sectional illustration of an LED array with trenches.

FIG. 11B shows a cross section view of an example LED array 1001. As shown, the pixels 11010, 11020, and 11030 correspond to three different pixels within an LED array such that a separation sections 11041 and/or n-type contacts 11040 separate the pixels from each other. Pixels 11010, 11020, and 11030 may be arranged within LED array 1001 in accordance with the arrangements shown in FIGS. 1A-10B. According to an embodiment, the space between pixels may be occupied by an air gap. As shown, pixel 11010 includes an epitaxial layer 11011 which may be grown on any applicable substrate such as, for example, a sapphire substrate, which may be removed from the epitaxial layer 11011. A surface of the growth layer distal from contact 11015 may be substantially planar or may be patterned. A p-type region 11012 may be located in proximity to a p-contact 11017. An active region 11021 may be disposed adjacent to the n-type region and a p-type region 11012. Alternatively, the active region 11021 may be between a semiconductor layer or n-type region and p-type region 11012 and may receive a current such that the active region 11021 emits light beams. The p-contact 11017 may be in contact with SiO2 layers 11013 and 11014 as well as plated metal layer 11016 (e.g., plated copper). Then type contacts 11040 may include an applicable metal such as Cu. The metal layer 11016 may be in contact 11015 which may be reflective.

Notably, as shown in FIG. 11B, the n-type contact 11040 may be deposited into trenches 1130 created between pixels 11010, 11020, and 11030 and may extend beyond the epitaxial layer. Separation sections 11041 may separate all (as shown) or part of a converter material 11050. It will be understood that a LED array may be implemented without such separation sections 11041 or the separation sections 11041 may correspond to an air gap. The separation sections 11041 may be an extension of the n-type contacts 11040, such that, separation sections 11041 are formed from the same material as the n-type contacts 11040 (e.g., copper). Alternatively, the separation sections 11041 may be formed from a material different than the n-type contacts 11040. According to an embodiment, separation sections 11041 may include reflective material. The material in separation sections 11041 and/or the n-type contact 11040 may be deposited in any applicable manner such as, for example, but applying a mesh structure which includes or allows the deposition of the n-type contact 11040 and/or separation sections 11041. Converter material 11050 may have features/properties similar to wavelength converting layer 205 of FIG. 12A. As noted herein, one or more additional layers may coat the separation sections 11041. Such a layer may be a reflective layer, a scattering layer, an absorptive layer, or any other applicable layer. One or more passivation layers 11019 may fully or partially separate the n-contact 11040 from the epitaxial layer 11011.

The epitaxial layer 11011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 11012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 11050 (e.g., phosphor converted LED, "POLED", etc.) that acts to further modify wavelength of the emitted light to output a light of a second wavelength.

Although FIG. 11B shows an example LED array 1001 with pixels 11010, 11020, and 11030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 11050 may be in the path of light emitted by active region 11021, such that the light emitted by active region 11021 may traverse through one or more intermediate layers (e.g., a photonic layer).

According to embodiments, wavelength converting layer 11050 or may not be present in LED array 1001. The wavelength converting layer 11050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 11050 may be determined based on the material used or application/wavelength for which the LED array 1001 or individual pixels 11010, 11020, and 11030 is/are arranged. For example, a wavelength converting layer 11050 may be approximately 20 µm, 50 µm or 200 µm. The wavelength converting layer 11050 may be provided on each individual pixel, as shown, or may be placed over an entire LED array 1001.

Primary optic 11022 may be on or over one or more pixels 11010, 11020, and/or 11030 and may allow light to pass from the active region 101 and/or the wavelength converting layer 11050 through the primary optic. Light via the primary optic may generally be emitted based on a Lambertian distribution pattern such that the luminous intensity of the light emitted via the primary optic 11022, when observed from an ideal diffuse radiator, is directly proportional to the cosine of the angle between the direction of the incident light and the surface normal. It will be understood that one or more properties of the primary optic 11022 may be modified to produce a light distribution pattern that is different than the Lambertian distribution pattern.

Secondary optics which include one or both of the lens 11065 and waveguide 11062 may be provided with pixels 11010, 11020, and/or 11030. It will be understood that although secondary optics are discussed in accordance with the example shown in FIG. 11B with multiple pixels, secondary optics may be provided for single pixels. Secondary optics may be used to spread the incoming light (diverging optics), or to gather incoming light into a collimated beam (collimating optics). The waveguide 11062 may be coated with a dielectric material, a metallization layer, or the like and may be provided to reflect or redirect incident light. In alternative embodiments, a lighting system may not include one or more of the following: the wavelength converting layer 11050, the primary optics 11022, the waveguide 11062 and the lens 11065.

Lens 11065 may be formed form any applicable transparent material such as, but not limited to SiC, aluminum oxide, diamond, or the like or a combination thereof. Lens 11065 may be used to modify the a beam of light to be input into the lens 11065 such that an output beam from the lens 11065 will efficiently meet a desired photometric specification. Additionally, lens 11065 may serve one or more aesthetic purpose, such as by determining a lit and/or unlit appearance of the multiple LED devices 200B.

Figure 11C:
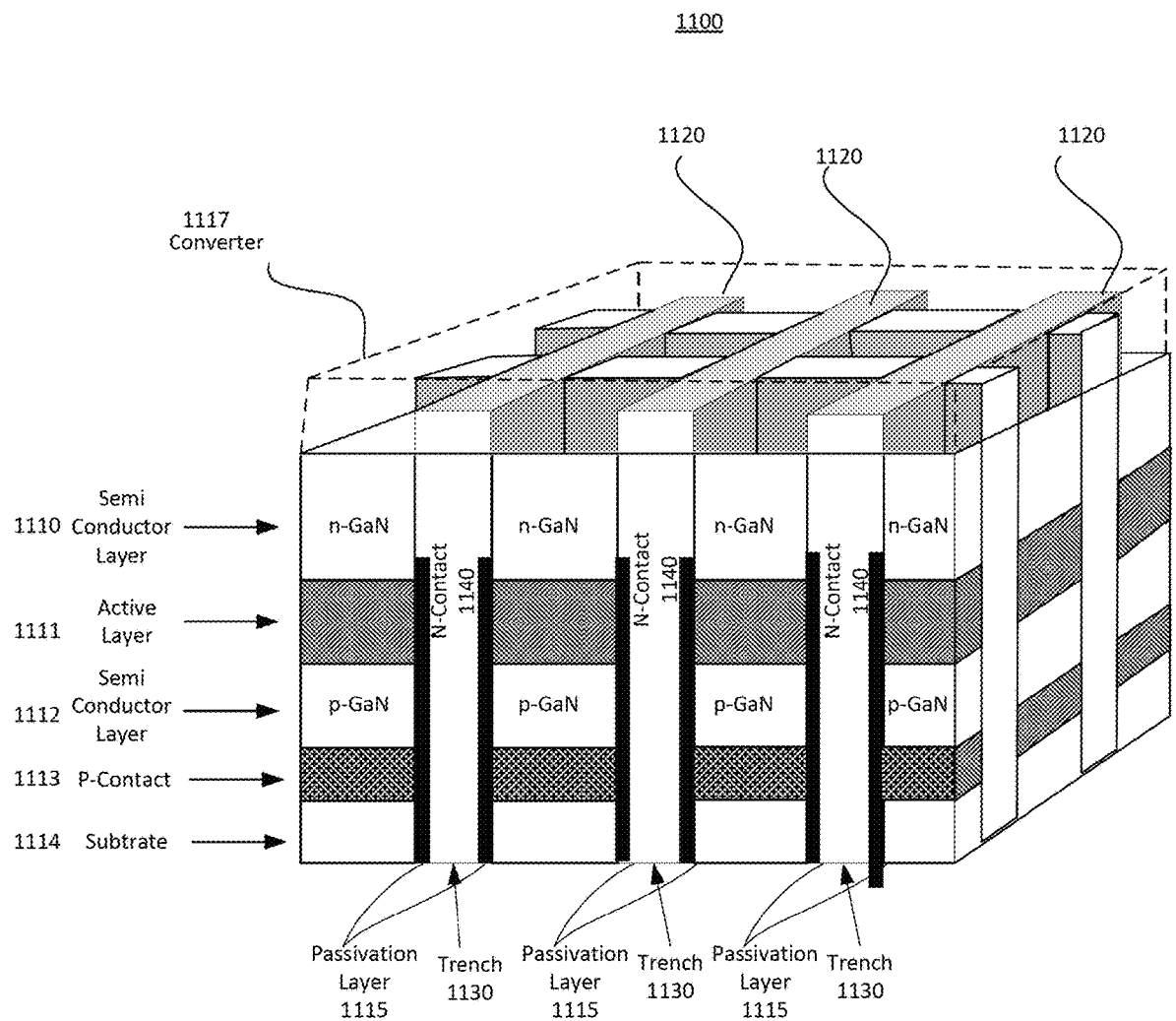
FIG. 11C is a perspective illustration of another LED array with trenches.

FIG. 11C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 such that the n-contacts 1140, or other applicable material, provide complete or partial optical isolation between the pixels.

Figure 12A:
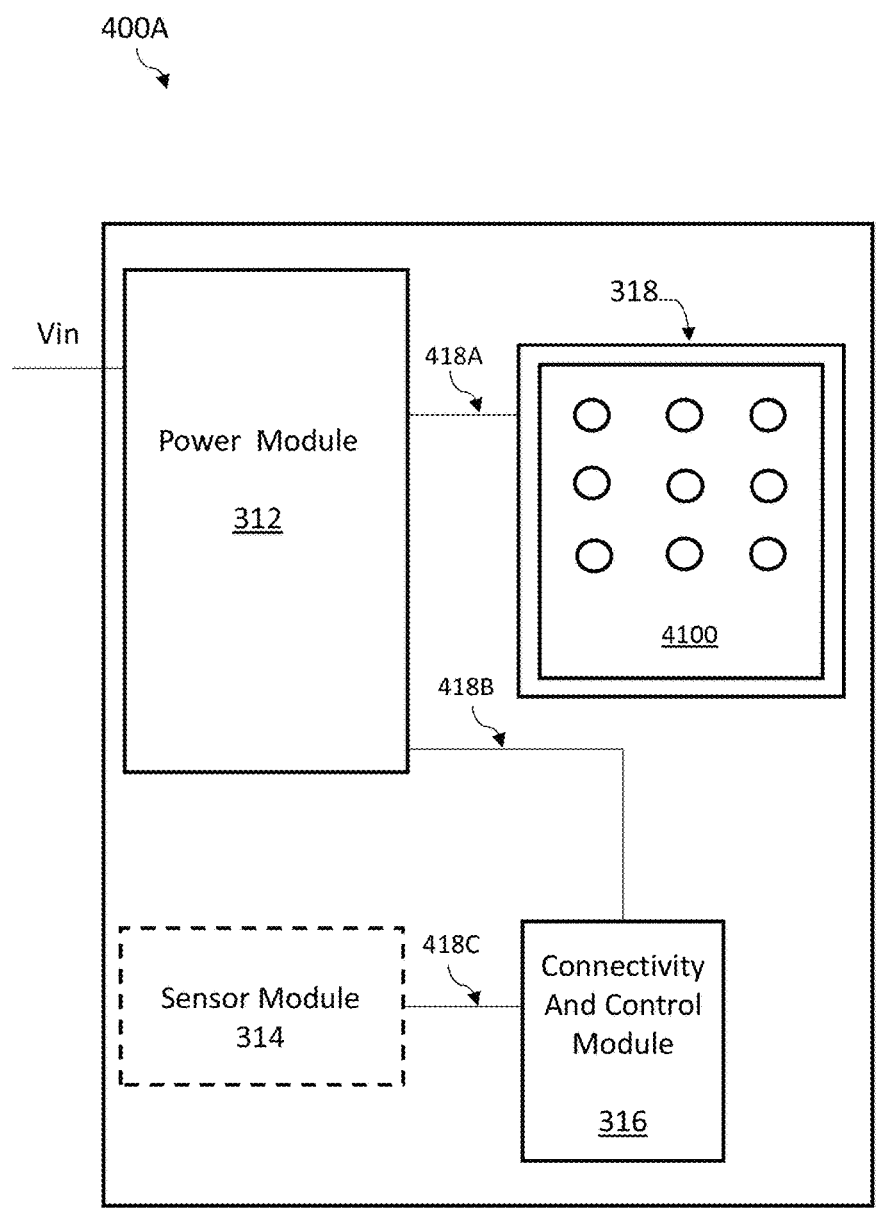
FIG. 12A is a top view of the electronics board with LED array attached to the substrate at the LED device attach region in one embodiment.

FIG. 12A is a top view of an electronics board with an LED array 4100 attached to a substrate at the LED device attach region 318 in one embodiment. Pixels in the LED array 4100 may be arranged in accordance with the arrangements shown in FIGS. 1A-10B. The electronics board together with the LED array 4100 represents an LED system 400A. Additionally, the power module 312 receives a voltage input at Vin 497 and control signals from the connectivity and control module 316 over traces 418B, and provides drive signals to the LED array 4100 over traces 418A. The LED array 4100 is turned on and off via the drive signals from the power module 312. In the embodiment shown in FIG. 12A, the connectivity and control module 316 receives sensor signals from the sensor module 314 over trace 4180.

Figure 12B:
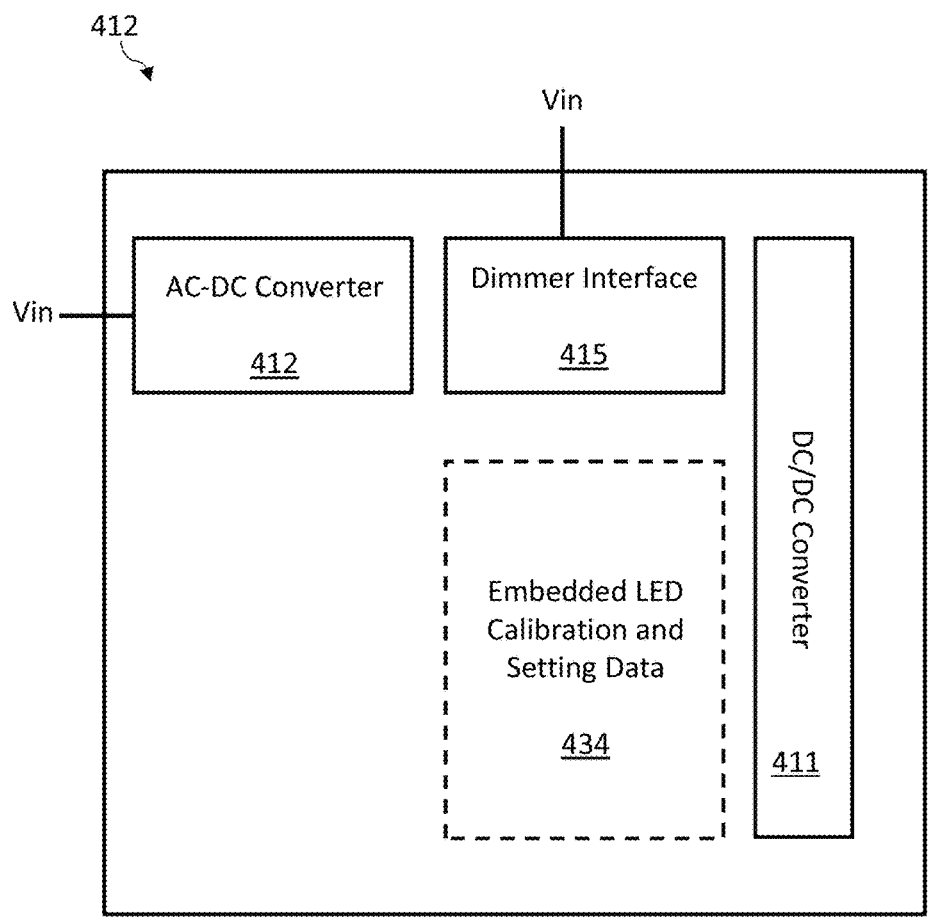
FIG. 12B is a diagram of one embodiment of a two channel integrated LED lighting system with electronic components mounted on two surfaces of a circuit board.

FIG. 12B illustrates one embodiment of a two channel integrated LED lighting system with electronic components mounted on two surfaces of a circuit board 499. As shown in FIG. 12B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 4100 mounted on it. The LED array 4100 is driven by two independent channels 411A and 411B. In alternative embodiments, a single channel may be used to provide the drive signals to an LED array, or any number of multiple channels may be used to provide the drive signals to an LED array.

The LED array 4100 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 4100. The LEDs in one of the groups of LEDs may be configured to emit light having a different color point than the LEDs in the second group of LEDs. Control of the composite color point of light emitted by the LED array 4100 may be tuned within a range by controlling the current and/or duty cycle applied by the individual DC/DC converter circuits 440A and 440B via a single channel 411A and 411B, respectively. Although the embodiment shown in FIG. 12B does not include a sensor module (as described in FIG. 12A), an alternative embodiment may include a sensor module.

The illustrated LED lighting system 400B is an integrated system in which the LED array 4100 and the circuitry for operating the LED array 4100 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 12C:
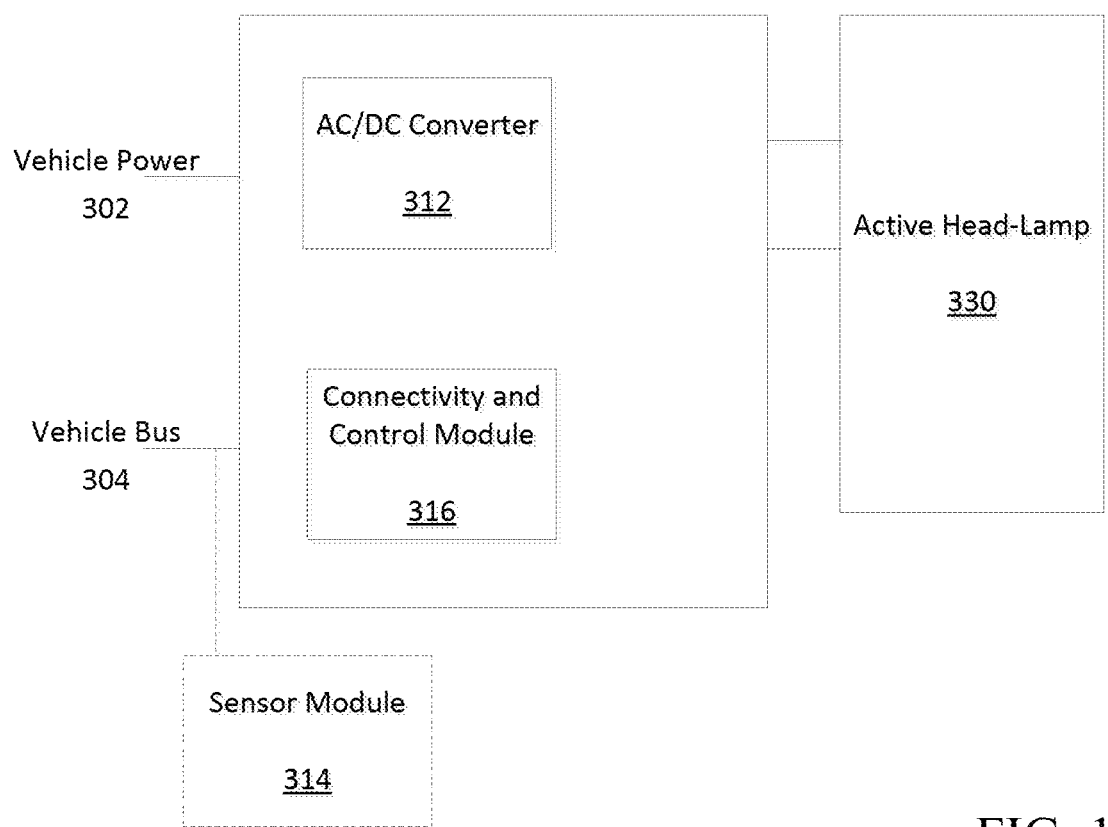
FIG. 12C is an example vehicle headlamp system.

FIG. 12C shows an example vehicle headlamp system 301 including a vehicle power 302 including a data bus 304. A sensor module 307 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 307 may be similar to or the same as the sensor module 314 of FIG. 12A. AC/DC Converter 305 may be connected to the vehicle power 302. Pixels in the active head lamp 330 may be arranged in accordance with the arrangements shown in FIGS. 1A-10B.

The power module 312 (AC/DC converter) of FIG. 12C may be the same as or similar to the AC/DC converter 412 of FIG. 2B and may receive AC power from the vehicle power 302. It may convert the AC power to DC power as described in FIG. 12B for AC-DC converter 412. The vehicle head lamp system 301 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 13:
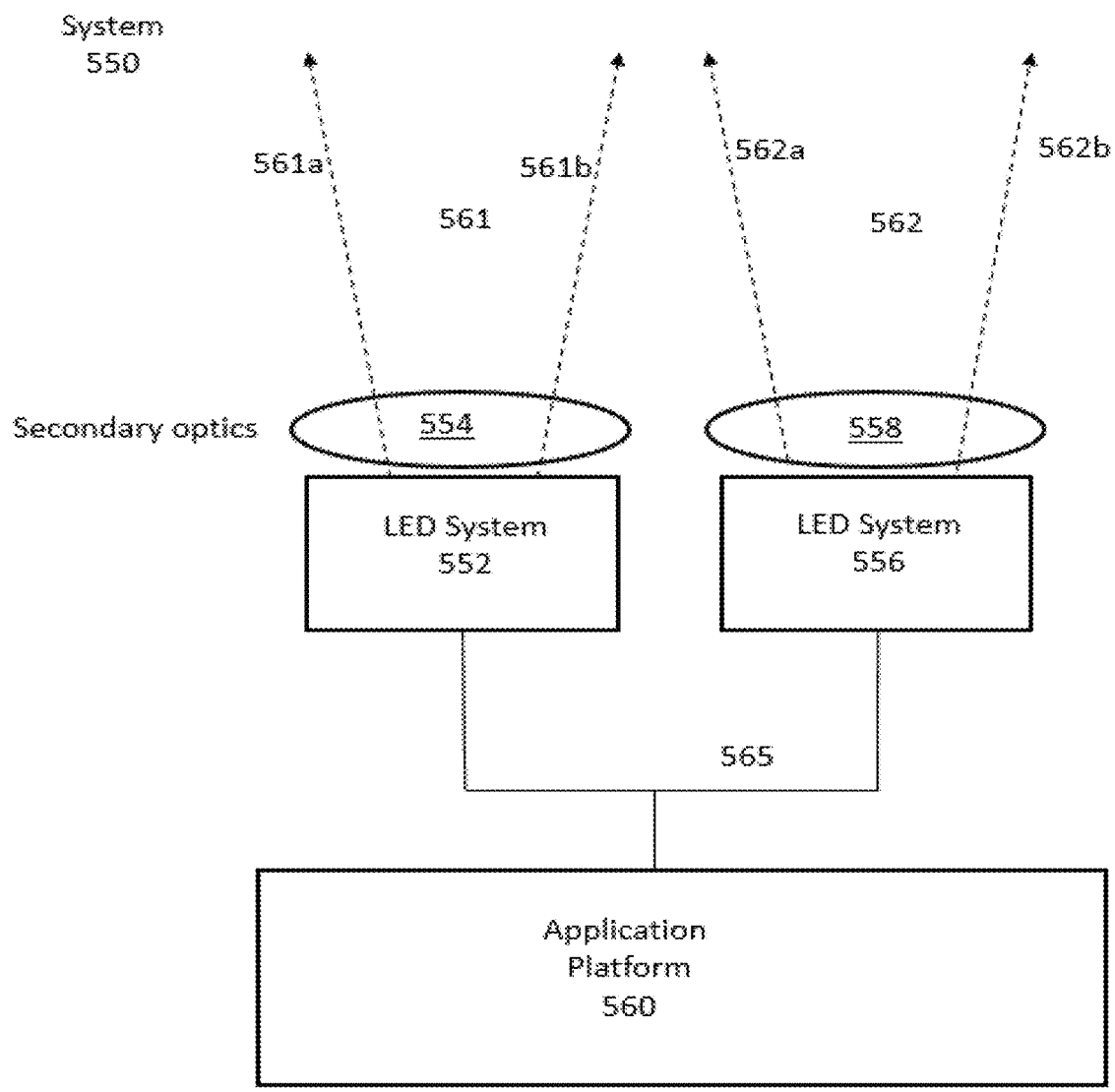
FIG. 13 shows an example illumination system.

FIG. 13 shows an example system 550 which includes an application platform 560, LED systems 552 and 556, and optics 554 and 558. Pixels in LED arrays in the LED systems 552 and 556 may be arranged in accordance with the arrangements shown in FIGS. 1A-10B. The LED System 552 produces light beams 561 shown between arrows 561a and 561b. The LED System 556 may produce light beams 562 between arrows 562a and 562b. In the embodiment shown in FIG. 13, the light emitted from LED System 552 passes through secondary optics 554, and the light emitted from the LED System 558 passes through secondary optics 556. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 12A and vehicle head lamp system 301 shown in FIG. 12C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 12A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 12A and 307 of FIG. 12C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

The invention claimed is:

1. A device comprising:
   a segmented first conductivity layer, a segmented active layer, and a second conductivity layer, arranged in a cascading arrangement with each segment of the active layer between the second conductivity layer and a corresponding segment of the first conductivity layer so as to form a corresponding pixel of a plurality of pixels, each segment of the first conductivity layer leaving exposed a peripheral portion of a surface of the corresponding segment of the active layer;
   a wavelength converting layer disposed on a corresponding portion of a surface of the second conductivity layer opposite a surface thereof that faces the segments of the active layer;
   a plurality of first contacts, each first contact being electrically connected to a corresponding segment of the first conductivity layer different from other segments connected to other first contacts of the plurality; and
   one or more second contacts that are electrically connected to the second conductivity layer.

2. The device of claim 1, wherein each of the pixels has a width between 100 and 500 microns.

3. The device of claim 1, further comprising an optically isolating material formed in one or more of a plurality of trenches separating adjacent segments of the active layer from one another.

4. The device of claim 3, wherein the optically isolating material includes one or more of a reflective material, a distributed Bragg reflector (DBR), an absorptive material, or a scattering material.

5. The device of claim 1, wherein the wavelength converting layer includes phosphor particles.

6. The device of claim 1, further comprising a passivation layer between the wavelength converting layer and the second conductivity layer.

7. The device of claim 3, wherein the optically isolating material separates adjacent segments of the first conductivity layer from one other.

8. The device of claim 1, wherein each one of the pixels is arranged so as to emit light in response to current flowing through the corresponding first contact.

9. The device of claim 1, wherein the second conductivity layer is a continuous conductivity layer.

10. The device of claim 9, wherein the second contacts are fewer in number than the first contacts.

11. The device of claim 1, wherein:
    the second conductivity layer is a segmented layer, each pixel including a corresponding segment of the second conductivity layer in the cascading arrangement, each segment of the active layer leaving exposed a peripheral portion of a surface of the corresponding segment of the second conductivity layer; and
    each one of a plurality of the second contacts is electrically connected to a corresponding segment of the second conductivity layer different from other second contacts of the plurality.

12. The device of claim 11, further comprising an optically isolating material formed in one or more of a plurality of trenches separating adjacent segments of the second conductivity layer from one another.

13. The device of claim 12, wherein the optically isolating material includes one or more of a reflective material, a distributed Bragg reflector (DBR), an absorptive material, or a scattering material.

14. The device of claim 12, wherein the optically isolating material separates adjacent segments of the active layer from one other.

15. The device of claim 14, wherein the optically isolating material separates adjacent segments of the first conductivity layer from one other.

16. The device of claim 1, wherein the wavelength converting layer is a continuous layer.

17. The device of claim 1, wherein the wavelength converting layer is segmented, each segment of the wavelength converting layer being disposed on a corresponding portion of a surface of the second conductivity layer opposite a surface thereof that faces a corresponding one of the segments of the active layer.

18. The device of claim 17, further comprising an optically isolating material formed in one or more of a plurality of trenches at least partly separating adjacent segments of the wavelength converting layer from one another.

19. The device of claim 17, wherein the optically isolating material includes one or more of a reflective material, a distributed Bragg reflector (DBR), an absorptive material, or a scattering material.

20. The device of claim 1, further comprising a light-extraction pattern formed between the second conductivity layer and the wavelength converting layer.

* * * * *